United States Patent [19]
Okudaira et al.

[11] Patent Number: 5,453,952
[45] Date of Patent: Sep. 26, 1995

[54] SEMICONDUCTOR DEVICE HAVING PERIPHERAL CIRCUIT FORMED OF TFT (THIN FILM TRANSISTOR)

[75] Inventors: Tomonori Okudaira; Kaoru Motonami, both of Hyogo, Japan

[73] Assignee: Mitsubishi Denki Kabushiki Kaisha, Tokyo, Japan

[21] Appl. No.: 869,937

[22] Filed: Apr. 17, 1992

[30] Foreign Application Priority Data

Apr. 23, 1991 [JP] Japan .................... 3-092184
Mar. 30, 1992 [JP] Japan .................... 4-073890

[51] Int. Cl.⁶ .................... H01L 29/78
[52] U.S. Cl. .................... 365/189.01; 365/72; 365/174; 365/182; 257/296; 257/377
[58] Field of Search .................... 365/149, 185, 365/117, 145, 109, 182, 189.01, 72, 174, 182; 257/296, 377

[56] References Cited

U.S. PATENT DOCUMENTS 5,146,425  9/1992  Kang et al. .................... 365/149
5,153,685 10/1992  Murata et al. .................... 257/296
5,202,849  4/1993  Nozaki .................... 365/149

FOREIGN PATENT DOCUMENTS 2-263386 10/1990 Japan .

OTHER PUBLICATIONS

"A Memory Cell with Polycrystalline Thin Film Transistor (TFT) for a 4Mbit SRAM", Electronic Information Communication Association, vol. 90, No. 48, pp. 7–13.

Primary Examiner—Viet Q. Nguyen
Attorney, Agent, or Firm—Lowe, Price, LeBlanc & Swecker

[57] ABSTRACT

A semiconductor device having an increased integration density. The semiconductor device includes a memory cell array, and a peripheral circuit region formed over the memory cell array and to be in electrical connection to the memory cell array for controlling the input/output of the data signals. A large part of a semiconductor chip area can therefore be used for the memory cell array, thereby increasing the integration density of the semiconductor device.

22 Claims, 22 Drawing Sheets

SEMICONDUCTOR DEVICE HAVING PERIPHERAL CIRCUIT FORMED OF TFT (THIN FILM TRANSISTOR)

BACKGROUND OF THE INVENTION

1. Field of the Invention

The present invention relates generally to a semiconductor device and a manufacturing method thereof, and more specifically, to a DRAM (Dynamic Random Access Memory) for storing and holding data signals and a manufacturing method thereof.

2. Description of the Background Art

Conventionally, a DRAM is known as a semiconductor device capable of randomly inputting information and outputting stored information. A DRAM is universally formed of a memory cell array which is a region for storing numerous pieces of information, and peripheral circuitry necessary for externally inputting/outputting signals.

FIG. 30 is a block diagram showing a conventional DRAM structure. Referring to FIG. 30, the conventional DRAM includes a memory cell array 61 for storing data signals indicative of information to be stored, an X-address buffer.decoder 62 for receiving external signals for selecting memory cells constituting a unit memory circuit and for selecting word lines, a Y-address buffer.decoder 63 for receiving external signals for selecting a memory cell and for selecting a bit line, a sense amplifier 64 for amplifying and reading out a stored signal in a memory cell, a data output buffer 65 for outputting data externally, and an R (Read)/W (Write) control circuit 66 for giving instructions as to data write/read.

Memory cell array 61 is provided with a plurality of word lines and bit lines crossing each other. Memory cells (not shown) are provided at the cross points of these word lines and bit lines. Memory cell selection is executed based on a cross point of one word line selected by X-address buffer.decoder 62 and one bit line selected by Y-address buffer-decoder 63. Data is written into the selected memory cell, or data stored in the selected memory cell is read out. Instructions as to the data write/read are given by read/write control signals (R/W) applied by R/W control circuit 66.

At the time of data writing, input data (Din) is input into a selected memory cell through R/W control circuit 66. At the time of data reading, data stored in a selected memory cell is detected by sense amplifier 64. The detected data is amplified by sense amplifier 64. The amplified data is output externally as output data (Dout) through data output buffer 65.

FIG. 31 is an equivalent circuit diagram showing a DRAM memory cell. Referring to FIG. 31, one memory cell 80 included in memory cell array 61 (see FIG. 30) includes a set of a field effect transistor 67 and a capacitor 68. The gate electrode of field effect transistor 67 is connected to a word line 69. A source/drain electrode of field effect transistor 67 on the side to be connected to capacitor 68 is connected to a bit line 70.

Description will be provided on writing/reading operations to/from memory cells. At the time of data writing, a prescribed potential is applied to word line 69, so that field effect transistor 67 is conducted and charge applied to bit line 70 is stored in capacitor 68.

At the time of data reading, a prescribed potential is applied to word line 69, so that field effect transistor 67 is conducted. The charge stored in capacitor 68 is taken out through bit line 70. The writing/reading operation to/from a memory cell is thus conducted.

FIG. 32 is a sectional view showing a structure of a conventional DRAM in section. FIG. 33 is a plan lay out showing the DRAM shown in FIG. 32.

Referring to FIGS. 32 and 33, the conventional DRAM is formed of a memory cell array 201 and a peripheral circuit 202.

Memory cell array 201 includes a p type semiconductor substrate 101, a field oxide film for element isolation 102, a p type diffusion layer for element isolation 103 formed beneath field oxide film 102, an n type source/drain diffusion layer 105 formed adjacent to field oxide film 102, an n type source/drain diffusion layer 104 formed a prescribed distance apart from an n type source/drain diffusion layer 105, a gate electrode 107 formed between n type source/drain diffusion layers 104 and 105 and on field oxide film 102 with a gate oxide film 106 therebetween, an upper insulating film 108 formed on the top of gate electrode 107, and a sidewall insulating film 109 formed on a sidewall of gate electrode 107. A pair of n type source/drain diffusion layers 104 and 105 and gate electrode 107 constitute a field effect transistor.

Memory cell array 201, further includes a storage node 110 electrically connected to n type source/drain diffusion layer 105 and formed extending over a gate electrode 107, a cell plate 112 formed on storage node 110 with a capacitor insulating film 111 therebetween. Storage node 110, capacitor insulating film 111 and cell plate 112 constitute a capacitor for storing signal charge.

Memory cell array 201 further includes an interlayer insulating film 113 formed covering the entire surface and having a contact hole 113b on n type source/drain diffusion layer 104, and a bit line 114 formed by a polycrystalline silicon layer electrically connected to n type source/drain diffusion layer 104 through contact hole 113b and formed extending over cell plate 112.

Peripheral circuit 202 includes an impurity diffusion layer 116. Bit line 114 is electrically connected to impurity diffusion layer 116 through a contact hole 113a provided in interlayer insulating film 113. Impurity diffusion layer 116 represents one end of peripheral circuit 202, and peripheral circuitry (not shown) such as a plurality of transistors are formed adjacent to impurity diffusion layers 116.

FIGS. 34 to 44 are sectional views for illustrating a manufacturing process of the DRAM shown in FIG. 32.

Referring to FIGS. 34 to 44, the manufacturing process will be described.

As shown in FIG. 34, a field oxide film for element isolation 102 is formed on a p type semiconductor substrate 101 formed of a Si substrate by means of LOCOS (Local Oxidation of Silicon). Boron (B) ions are implanted into field oxide film 102, and a p type diffusion layer for element isolation 103 is formed for reinforcing element isolation.

As shown in FIG. 35, gate oxide film (layer) 106, gate electrode (layer) 107 and upper insulating film (layer) 108 are formed. A photoresist pattern 122 is formed in a prescribed region on upper insulating film (layer) 108.

As shown in FIG. 36, gate electrode 107 and upper insulating film 108 are formed by means of anisotropic etching, using photoresist pattern 122 (see FIG. 35) as a mask. Impurity ions are implanted into p type semiconductor substrate 101, using gate electrode 107 and upper insulating film 108 as masks. N type source/drain diffusion layers 104 and 105 are thus formed. N type impurity diffusion layer 116 is formed at that time.

Referring to FIG. 37, sidewall insulating film (layer) 109 is formed on the entire surface. Then, as shown in FIG. 38 sidewall insulating film (layer) 109 (see FIG. 37) is anisotropically etched, and sidewall insulating films 109 are left on the sidewalls of gate electrode 107.

As shown in FIG. 39, storage node (layer) 110 is formed on the entire surface. A photoresist pattern 123 is formed in a prescribed region on storage node (layer) 110. Storage node (layer) 110 is anisotropically etched, using photoresist 123 as masks, and the storage node 110 is shaped into a form as shown in FIG. 40.

Then, as shown in FIG. 41, capacitor insulating film (layer) 111 and cell plate (layer) 112 are formed on the entire surface. A photoresist pattern 124 is formed in a prescribed region on cell plate (layer) 112. Cell plate (layer) 112 and capacitor insulating film (layer) 111 are selectively etched, using photoresist pattern 124 as a mask. As shown in FIG. 42, prescribed shapes of capacitor insulating film 111 and cell plate 112 are thus obtained. Storage node 110, capacitor insulating film 111 and cell plate 112 constitute a capacitor for storing signal charge.

As shown in FIG. 43, interlayer insulating film 113 is formed on the entire surface. A photoresist pattern 125 with the portions needed for contact holes opened is formed. One possible method of forming photoresist pattern 125 with the portions needed for contact holes opened will be described. First, resist is formed on the entire surface. Portions to be opened in the resist are exposed by means of reduction-type projection using a mask. Thus, photoresist pattern 125 with the portions needed for contact holes opened is obtained. After interlayer insulating film 113 is selectively etched, using photoresist pattern 125 as a mask, photoresist pattern 125 is removed. Contact holes 113a and 113b are thus formed as shown in FIG. 44. Finally, as shown in FIG. 32, polycrystalline silicon layer 114 connected electrically to n type source/diffusion layer 104 and impurity diffusion layer 116 and extending over cell plate 112 is formed. Polycrystalline silicon layer 114 constitute bit line 114.

The memory cell array 201 and peripheral circuit 202 of the conventional DRAM is formed in the above-described manner.

As in the foregoing, in the case of the conventional DRAM, memory cell array 201 and peripheral circuit 202 are formed adjacent to each other as shown in FIG. 32. Therefore, a semiconductor chip is necessary, which has an area covering memory cell array 201 and peripheral circuit 202. On the other hand, there always exist a demand for higher integration density in the field of semiconductor devices. It is not possible to sufficiently satisfy the demand by conventional methods.

Also the following problems exist in the conventional manufacturing processes. FIGS. 45 and 46 are views schematically showing the relation between the in-focus position of a lens and the cross sectional shape of resist in a lithography process. Referring to FIG. 45, resist 151 formed on a layer to be etched 150 is exposed to light in its prescribed region through a lens 152. In this case, the in-focus position 153 of lens 152 is high, and a contact hole 151a is therefore not formed to be a complete opening.

Conversely, in the state shown in FIG. 46, with the in-focus position 153 of lens 152 being low, the contact hole 151a is formed to be a complete opening. The opening diameter of the contact hole 151a increases upwardly, which makes it difficult to form the contact hole 151a as designed, resulting in a bad shape.

FIG. 47 is a view schematically showing the relation between the thickness of resist and an optimum in-focus position. Referring to FIG. 47, the optimum in-focus position for forming a contact hole 161a positioned in the A side portion is the position designated by 165a, while the optimum in-focus position for forming a contact hole 161b positioned in the B side portion is the position designated by 165b. As described above, when layer to be etched 160 has steps, the heights of the optimum positions for the A side portion and B side portion are different. When contact holes 161a and 161b are formed in the same manufacturing process, however, the heights of the in-focus positions are the same for the A side portion and B side portion.

FIGS. 48 through 50 are views each schematically showing the relation between the in-focus position of a lens and a contact hole to be formed. Referring to FIG. 48, when the in-focus positions of lenses 162a and 162b are set to be the optimum position for contact hole 161a to be formed in the A side portion, the contact hole 161a is formed just as designed in the A side portion. However, in the B side portion, the contact hole 161b to be formed does not take a shape of a complete opening, because the in-focus position 165a is too high.

Referring to FIG. 49, when the in-focus positions of lenses 162a and 162b are set to be the optimum position for contact hole 161b in the B side portion, the contact hole 161b is provided just as designed in the B side portion. However, in the A side portion, the opening diameter of the contact hole 161a increases upwardly, because the in-focus position 165b is too low. Consequently, it is not possible to provide the contact hole 161a just as designed.

Now referring to FIG. 50, when the in-focus positions of lenses 162a and 162b are set to be an intermediate position between the in-focus position shown in FIG. 48 and the in-focus position shown in FIG. 49, the contact holes 161a and 161b respectively formed in the A side portion and B side portion both take bad shapes. More specifically, the opening diameter of the contact hole 161a in the A side portion increases upwardly, while the opening diameter of the contact hole 161b in the B side portion decreases downwardly.

As in the foregoing, if layer to be etched 160 has stepped portions and thus the height of resist 161 to be formed thereon is uneven, it will be difficult to form in the same manufacturing step contact holes just as designed respectively in the positions of different heights. In such a case, if etching is conducted using the resist mask, the resultant size of layer to be etched 160 turns out to be uneven. More specifically, when resist having a contact hole larger than designed is etched, an opening formed in a layer to be etched turns out to be larger than a designed size. Conversely, if etching is conducted using resist having a contact hole smaller than designed, an opening formed in the layer to be etched becomes smaller than originally designed.

FIG. 51 is a representation schematically showing an opening portion larger than a designed size formed in a layer to be etched, and FIG. 52 is a representation schematically showing an opening portion smaller than a designed size formed in a layer to be etched. FIG. 53 is a schematic representation for illustrating a problem when an opening larger than a designed size is formed as shown in FIG. 51. Referring to FIGS. 51 and 52, assume that interconnection layers 171a and 171b are formed in a layer to be etched 170. In the state shown in FIG. 51, with the opening portion being larger than the designed size, the area of contact between layer to be etched 170 and interconnection layer 171a becomes larger. Thus, they will not be any problem such as increase of contact resistance. However, when the opening portion is larger than the designed size, as shown in FIG. 53, an overlapping margin for interconnection layer 171a formed on layer to be etched 170 becomes smaller. More specifically, when there exist a plurality of layers to be etched 170 at prescribed intervals, interconnection layer 171a to be connected to one of these etching layers 170 should be kept from electrically contacting adjacent layers to be etched 170. Therefore, as shown in FIGS. 53, tolerance b for the formation position of interconnection layer 171a having a large contact diameter is smaller than tolerance a for the formation position of interconnection layer 171c having a normal contact diameter.

Conversely, as shown in FIG. 52, if the diameter of an opening formed in a layer to be etched 170 is smaller than a designed size, the contact area between interconnection layer 171b and layer to be etched 170 becomes smaller, thus increasing contact resistance. The aspect ratio also becomes large, and the coverage characteristic deteriorates as a result.

Various problems are encountered if a contact hole is not formed as designed in size. More specifically, there exist the following problems. In other words, in the manufacturing process shown in FIG. 43, it is difficult to form photoresist pattern 125 with openings corresponding to contact holes. More specifically, interlayer insulating film 113 is not identical in height at positions under two openings of photoresist pattern 125. The depths of the two openings of photoresist pattern 125 formed thereon will be different from each other. The difference in depth between these two openings, which is larger than a focus depth in exposure, makes it difficult to form openings as designed in size. If interlayer insulating film 113 is etched using photoresist pattern 125 having such openings formed not as designed, contact holes 113a and 113b formed in interlayer insulating film 113 cannot be formed as designed in size either. It is therefore difficult to provide contact resistance between bit lines 114 formed in the contact hole and p type semiconductor substrate 101 as intended.

SUMMARY OF THE INVENTION

It is therefore an object of the present invention to improve integration density in a semiconductor device.

Another object of the present invention is to increase an area occupied by a memory cell array region in a semiconductor chip area in a semiconductor device.

A further object of the present invention is to improve accuracy in the formation of contact holes for contacting bit lines to a semiconductor substrate in a manufacturing method of a semiconductor device.

Yet another object of the present invention is to form a bit lines as designed in size in a manufacturing method of a semiconductor device.

In accordance with one aspect of the present invention, a semiconductor device includes a memory cell region formed on a semiconductor substrate, an insulating layer having a contact hole and covering the entire memory cell region, a conductive layer formed in the contact hole, and a peripheral circuit formed on the insulating layer and electrically connected to the memory cell region through the conductive layer.

In operation, the peripheral circuit region is formed over the memory cell region, and, therefore, a large part of the chip area may be used for the memory cell region.

In accordance with another aspect of the present invention, a manufacturing method of a semiconductor device includes steps of forming memory cells on a semiconductor substrate, forming an insulating layer having contact holes on the memory cell, forming a conductive layer in the contact hole, and forming a peripheral circuit electrically connected to the conductive layer on the insulating layer.

In operation, the insulating layer having contact holes is formed on the memory cell after the memory cell is formed on the semiconductor substrate, and, therefore, the formation of a contact hole for connecting a bit line to the memory cell array region and the formation of a contact hole for connecting the bit line to the peripheral circuit region are conducted in separate manufacturing steps.

In accordance with another aspect of the present invention, a manufacturing method of a semiconductor device includes the steps of forming a transistor including a first gate electrode and a pair of impurity regions in a prescribed region on a semiconductor substrate, forming a capacitor connected electrically to one impurity region, exposing the other impurity region by etching a prescribed region of a first insulating layer after the first insulating layer covering the transistor and capacitor is formed, forming a bit line connected electrically to the exposed other impurity region and extending on the first insulating layer, exposing a part of the bit line by etching a prescribed region of a second insulating layer after the second insulating layer is formed on the bit line, forming a polycrystalline silicon layer electrically connected to the exposed bit line and extending on the surface of the second insulating layer, forming a second gate electrode on the polycrystalline silicon layer, and implanting impurity ions into the polycrystalline silicon layer using the second gate electrode as a mask.

In operation, the first insulating layer is formed covering the transistor and capacitor formed on the semiconductor substrate, the impurity region constituting the transistor is exposed by etching a prescribed region of the first insulating layer, a bit line electrically connected to the exposed impurity region is formed, and a part of the bit line is exposed by etching a prescribed region of a second insulating layer after the second insulating layer is formed on the bit line. Thus, the formation of a contact hole for connecting the bit line to the memory cell array region and the formation of a contact hole for connecting the bit line to the peripheral circuit region are carried out in separate manufacturing steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, the preferred embodiments of the present invention will be described in conjunction with the drawings.

Figure 1:
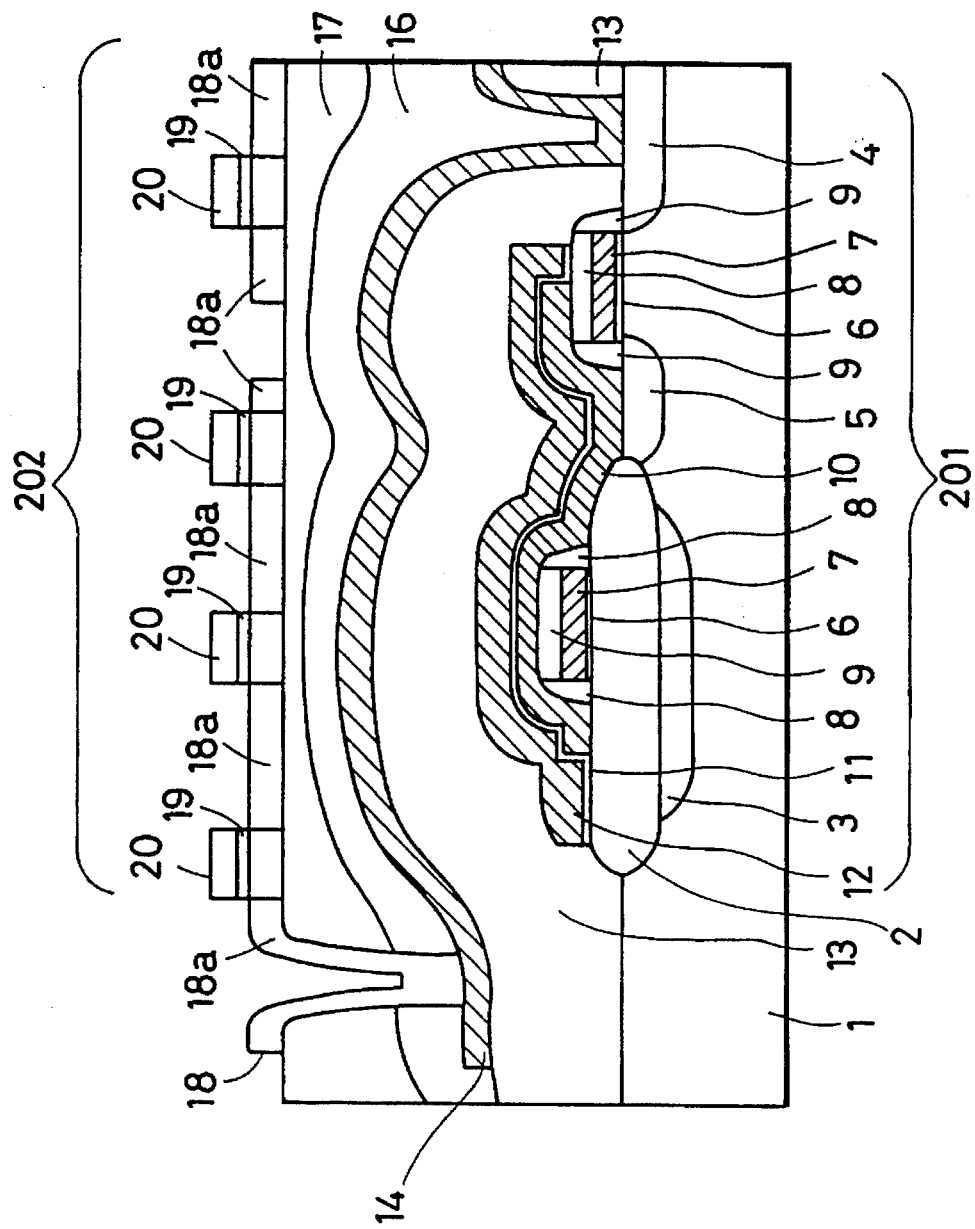
FIG. 1 is a sectional view showing a DRAM in accordance with one embodiment of the present invention.

Referring to FIG. 1, description will be provided on a structure of a DRAM in accordance with one embodiment of the present invention. The DRAM of the present embodiment includes a memory cell array 201, and a peripheral circuit 202. Peripheral circuit 202 is formed on the top of memory cell array 201.

Memory cell array 201 includes a p type semiconductor substrate 1, a field oxide film for element isolation 2 formed on p type semiconductor substrate 1, a p type diffusion layer for element isolation 3 formed under field oxide film 2 for reinforcing element isolation, n type source/drain diffusion layers 4 and 5 formed adjacent to field oxide film 2 and a prescribed distance apart from each other, a gate electrode 7 formed between n type source/drain diffusion layers 4 and 5, and on field oxide film 2 with a gate oxide film 6 therebetween, an upper insulating film 8 formed on gate electrode 7, a sidewall insulating film 9 formed on a sidewall of gate electrode 7, a storage node 10 electrically connected to n type source/drain diffusion layer 5 and extending on gate electrode 7, a cell plate 12 formed on storage node 10 with a capacitor insulating film 11 therebetween, an interlayer insulating film 13 formed covering the entire surface and having openings on n type source/drain diffusion layer 4, and a bit line 14 formed by a polycrystalline silicon layer electrically connected to n type source/drain diffusion layer 4 and extending over cell plate 12. N type source/drain diffusion layers 4 and 5, gate electrode 7 constituted a field effect transistor. Storage node 10, capacitor insulating film 11 and cell plate 12 constitute a capacitor for storing signal charges.

According to the present embodiment, peripheral circuit 202 is formed on the top of thus structured memory cell array 201. More specifically, bit line 14 is provided on its end with interlayer insulating films 16 and 17 each having contact holes.

Peripheral circuit 202 includes a polycrystalline silicon layer 18 electrically connected to bit line 14 through contact holes formed on the above-mentioned interlayer insulating films 16 and 17, and extending on the surface of the interlayer insulating film 17, and a TFT gate 20 formed between TFT source/drains 18a, 18a formed a prescribed distance apart from each other with a TFT gate insulating film 19 therebetween. The pair of TFT source/drains 18a, 18a adjacent to each other and TFT gate 20 constitute a TFT (Thin Film Transistor). Polysilicon layer 18 may be another semiconductor layer such as monocrystalline silicon layer, germanium layer, and gallium arsenic layer.

Figure 2:
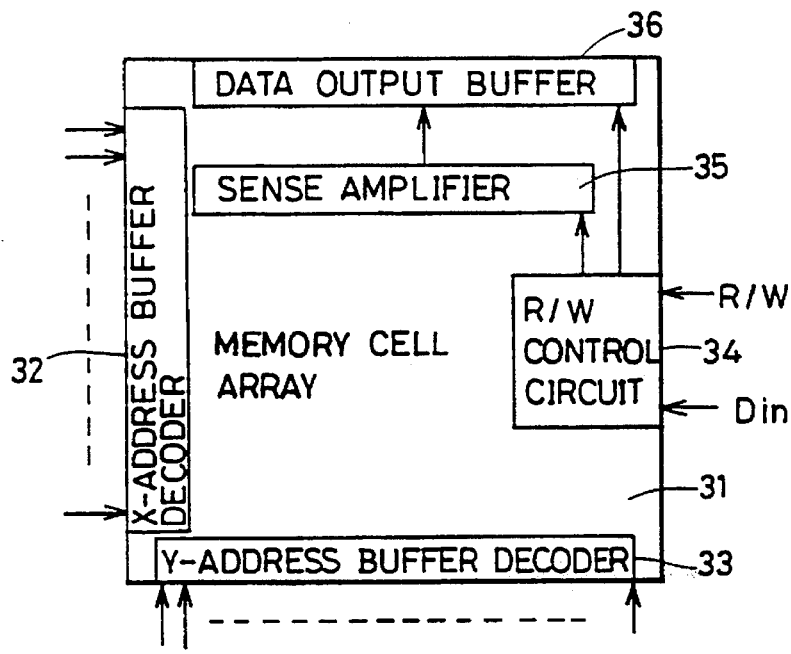
FIG. 2 is a block diagram showing a structure of the DRAM shown in FIG. 1.
Figure 3:
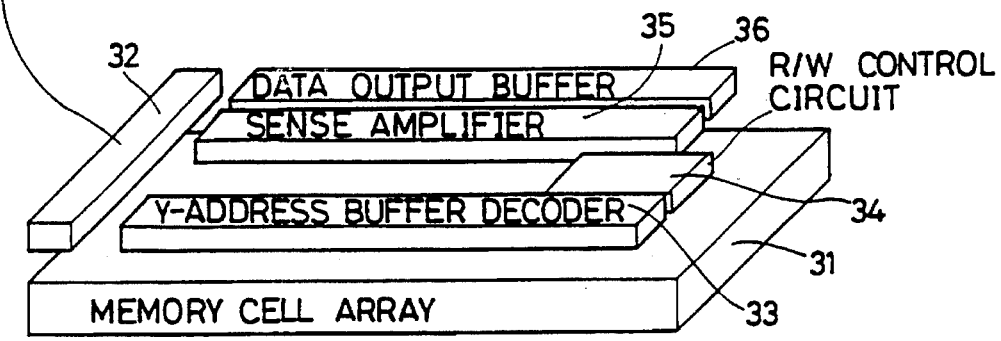
FIG. 3 is a perspective block diagram showing a structure of the DRAM shown in FIG. 1.
Figure 30:
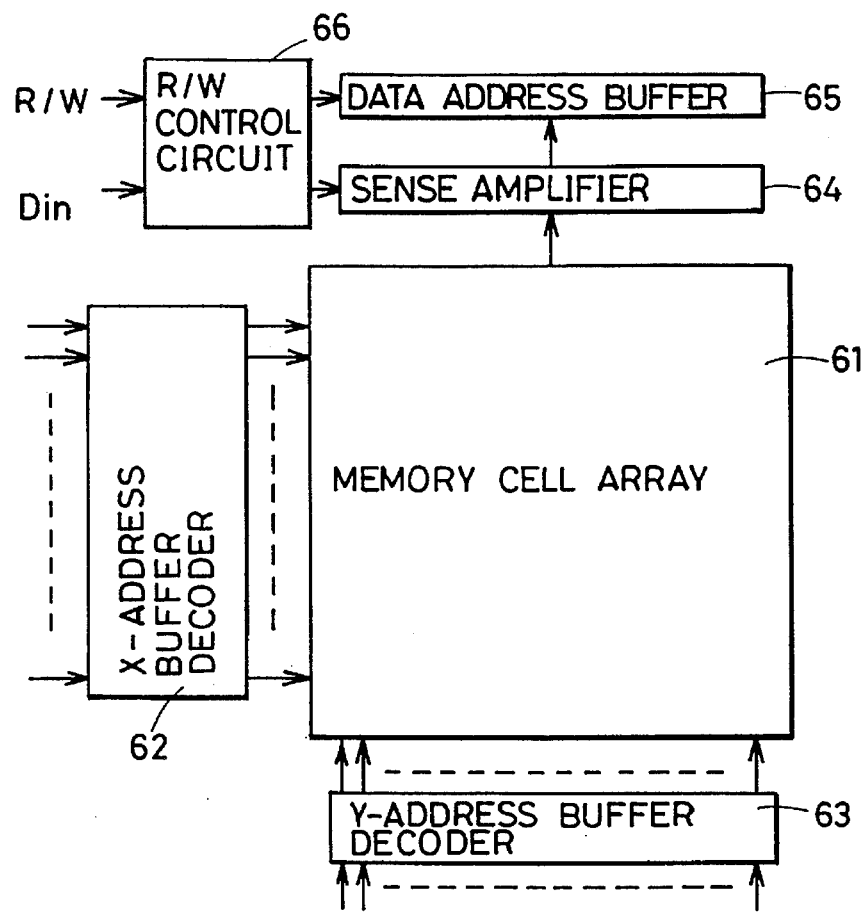
FIG. 30 is a block diagram showing a structure of a conventional DRAM.
Figure 31:
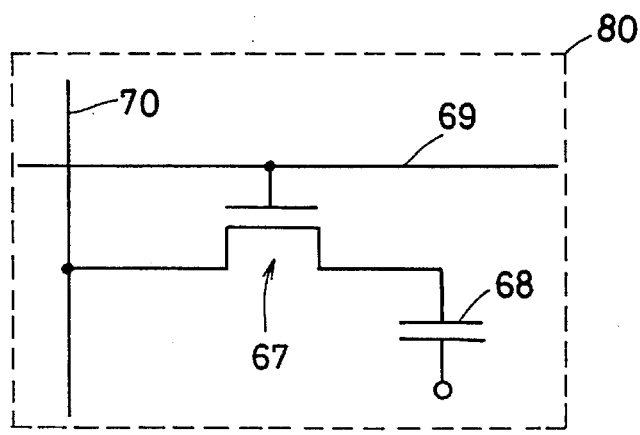
FIG. 31 is an equivalent circuit diagram showing a DRAM memory cell.
Figure 32:
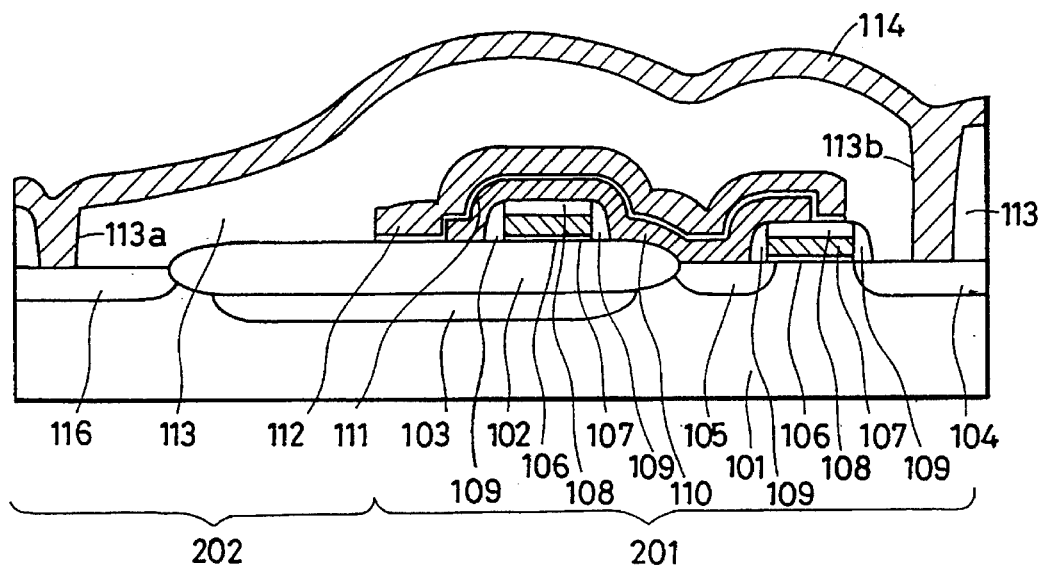
FIG. 32 is a sectional view showing a sectional structure of a conventional DRAM.
Figure 33:
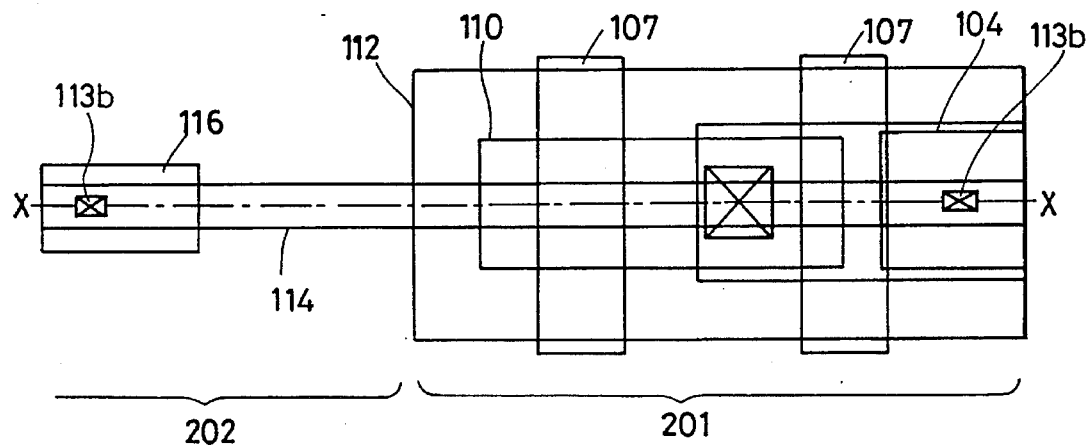
FIG. 33 is a plan layout showing the DRAM shown in FIG. 32.
Figure 34:
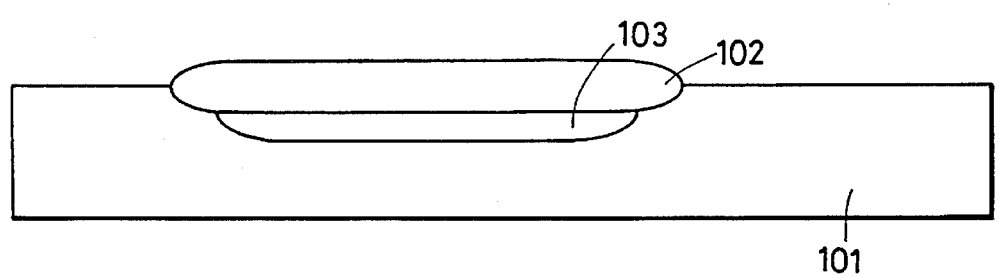
FIGS. 34 to 44 are sectional views for illustrating a manufacturing process of the DRAM shown in FIG. 32.
Figure 35:
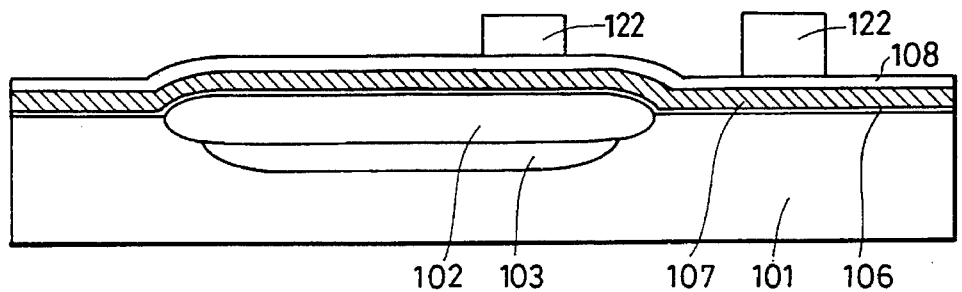
Figure 36:
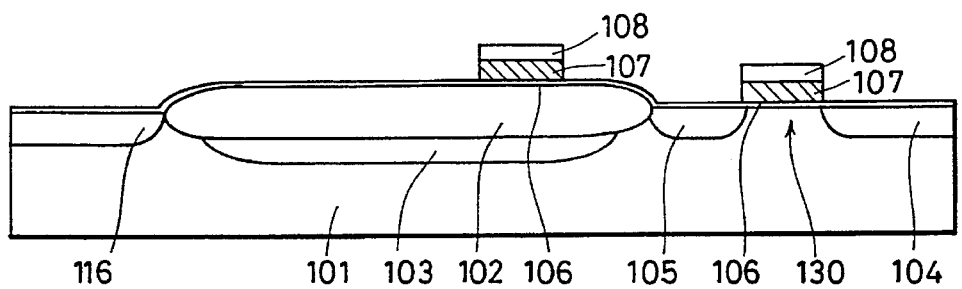
Figure 37:
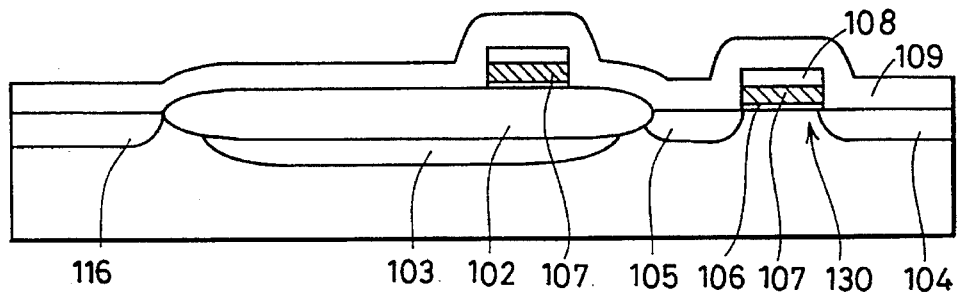
Figure 38:
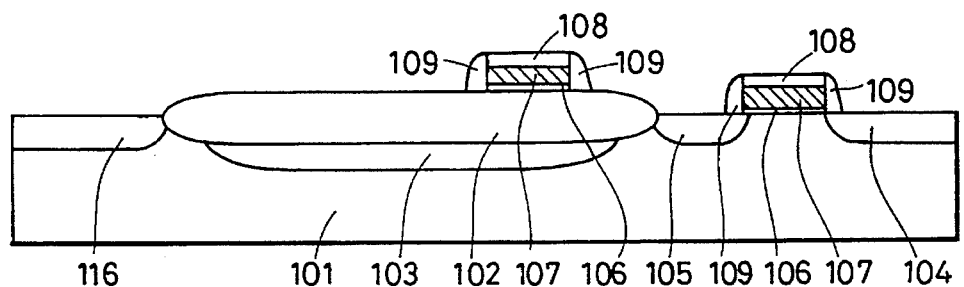
Figure 39:
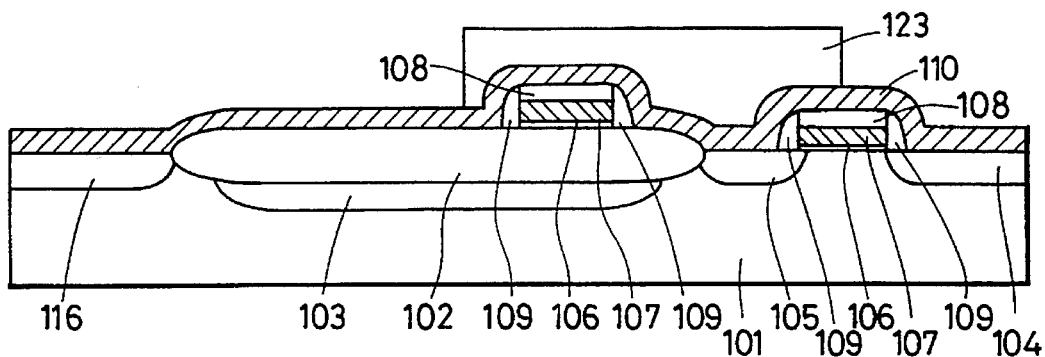
Figure 40:
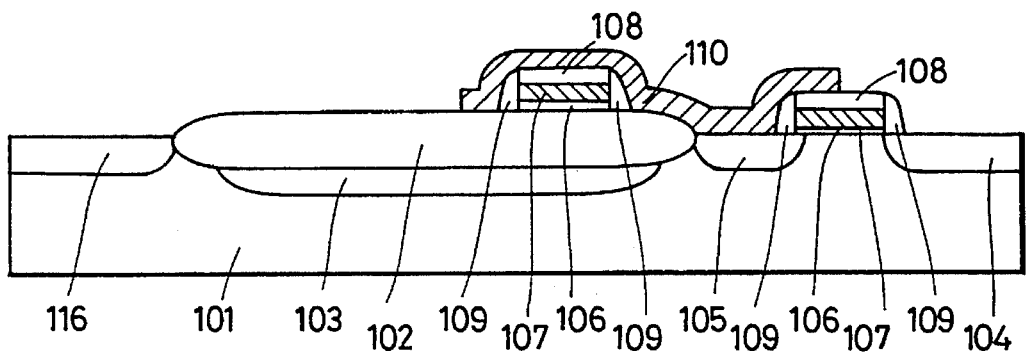
Figure 41:
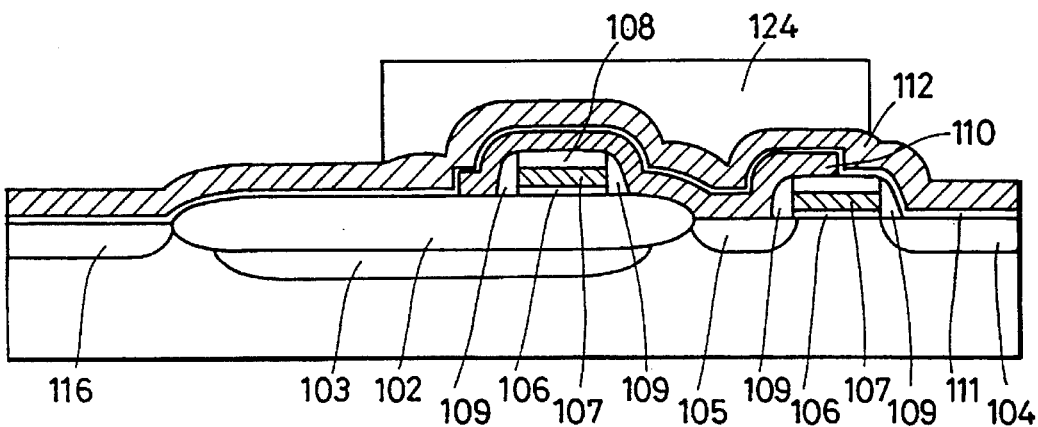
Figure 42:
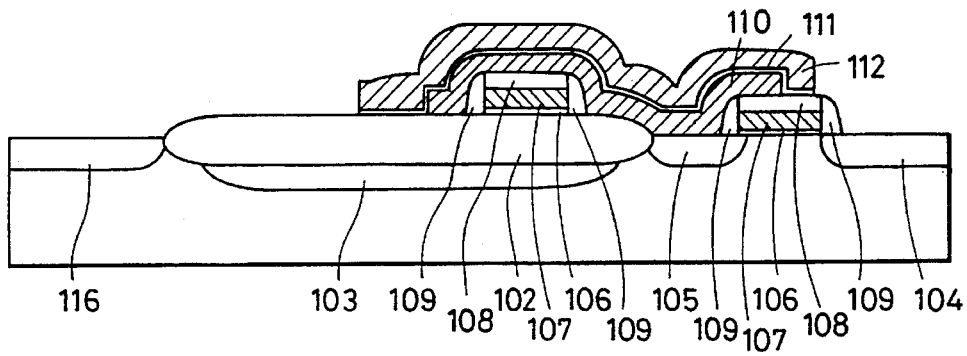
Figure 43:
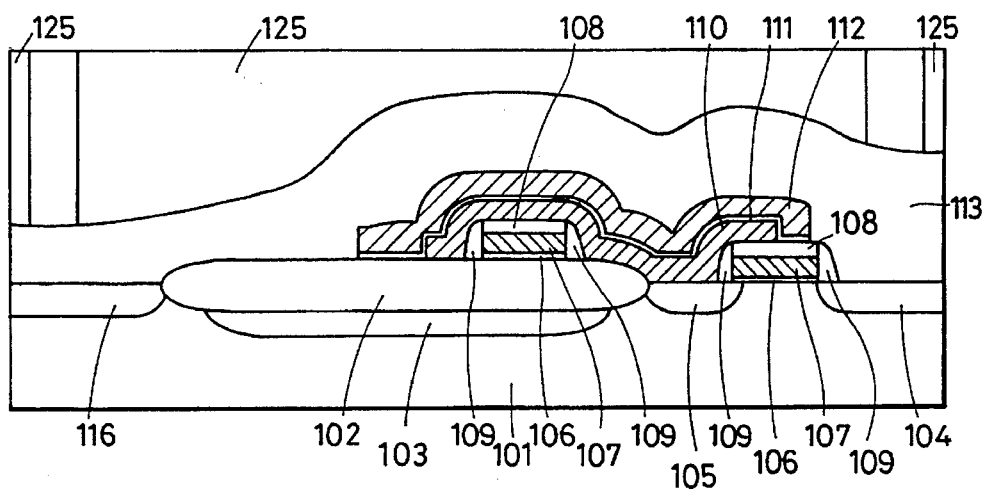
Figure 44:
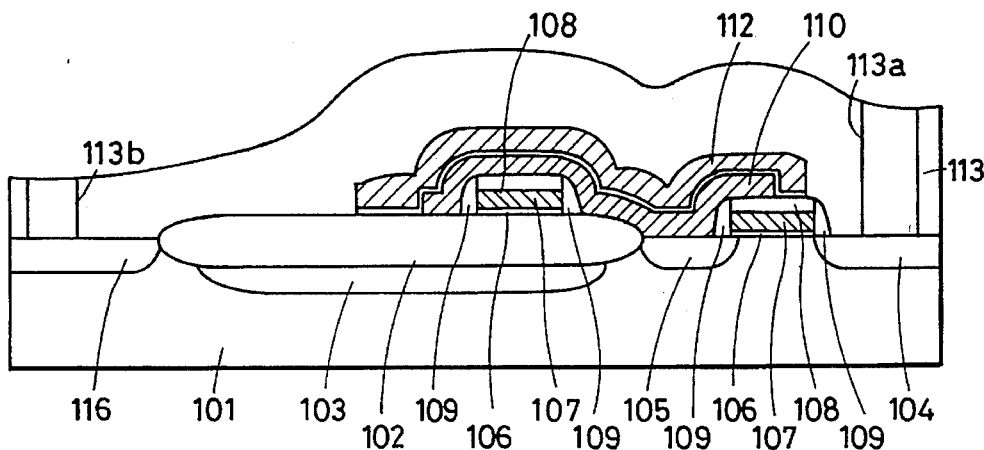
Figure 45:
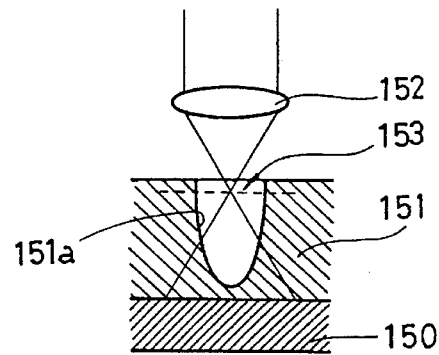
FIG. 45 is a schematic view for illustrating the relation between the in-focus position of a lens and a contact hole to be formed in a lithography technique.
Figure 46:
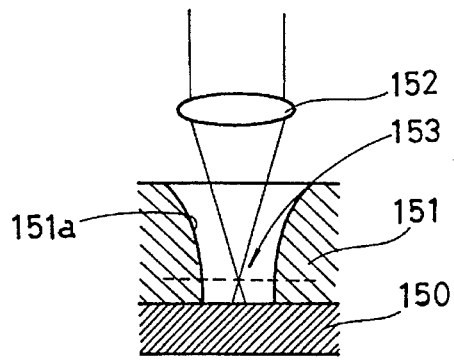
FIG. 46 is a schematic view for illustrating the relation between the in-focus position of a lens and a contact hole to be formed in a lithography technique.
Figure 47:
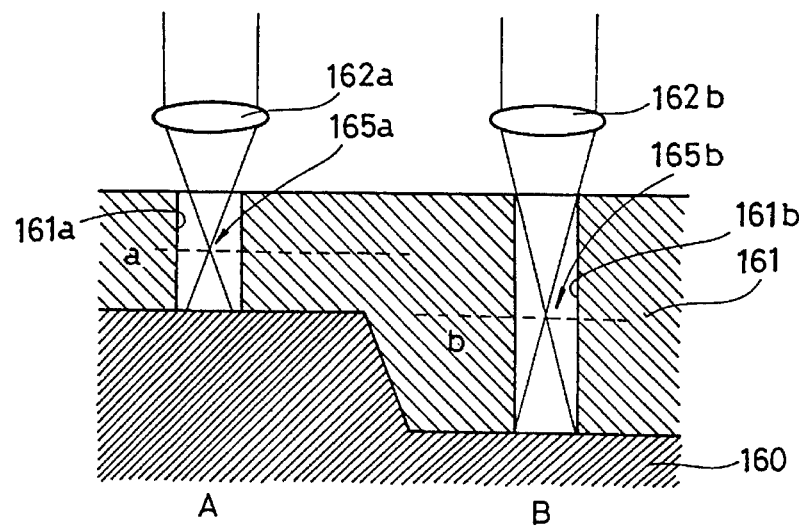
FIG. 47 is a schematic view for illustrating the optimum position of an in-focus position in a lithography technique.
Figure 48:
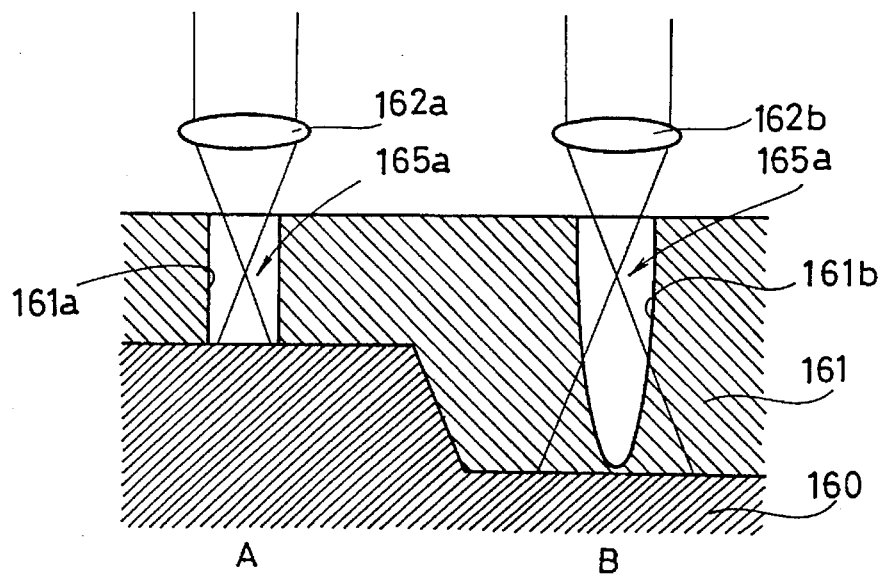
FIG. 48 is a schematic view showing the shape of a contact hole formed when the in-focus position of a lens is set to be an optimum position in the A side portion.
Figure 49:
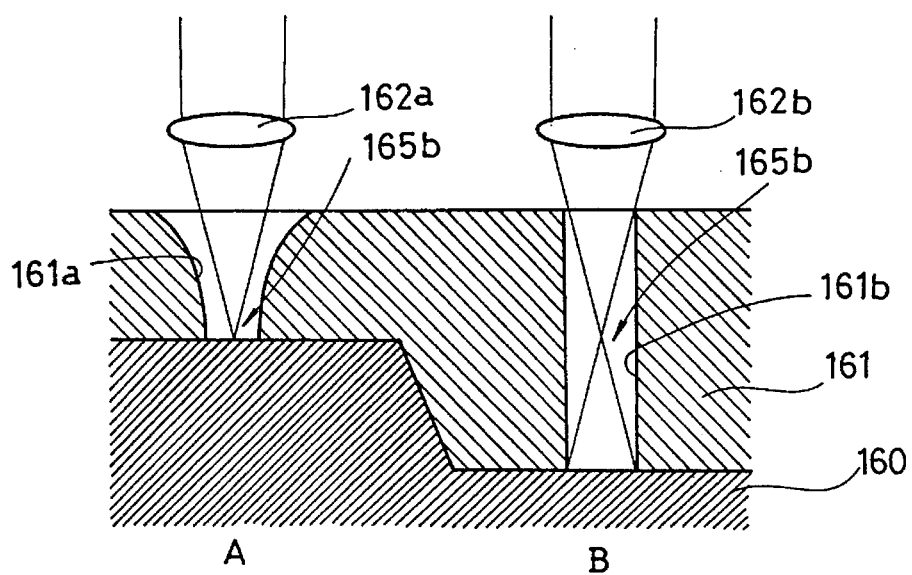
FIG. 49 is a schematic view showing the shape of a contact hole formed when the in-focus position of a lens is set to be an optimum position in the B side portion.
Figure 50:
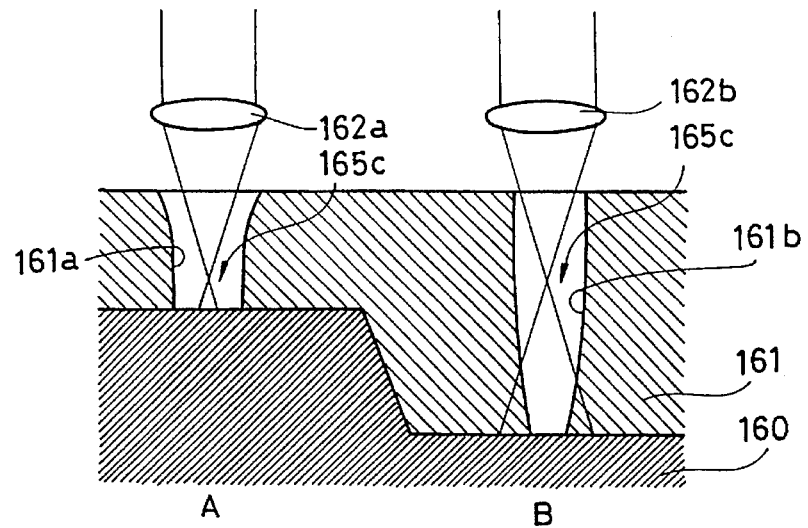
FIG. 50 is a schematic view showing the shape of a contact hole formed when the in-focus position of a lens is set to be an intermediate position of FIGS. 48 and 49.
Figure 51:
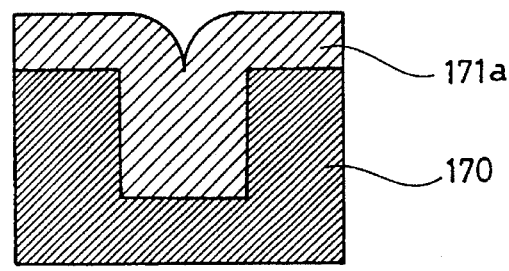
FIG. 51 is a schematic representation for illustrating the state of cross section when a contact hole formed in a layer to be etched is larger than a designed size.
Figure 52:
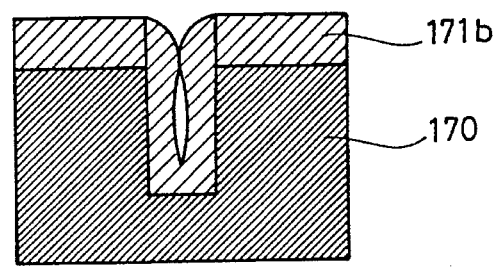
FIG. 52 is a schematic representation for illustrating the state of cross section when a contact hole formed in a layer to be etched is smaller than a designed size.
Figure 53:
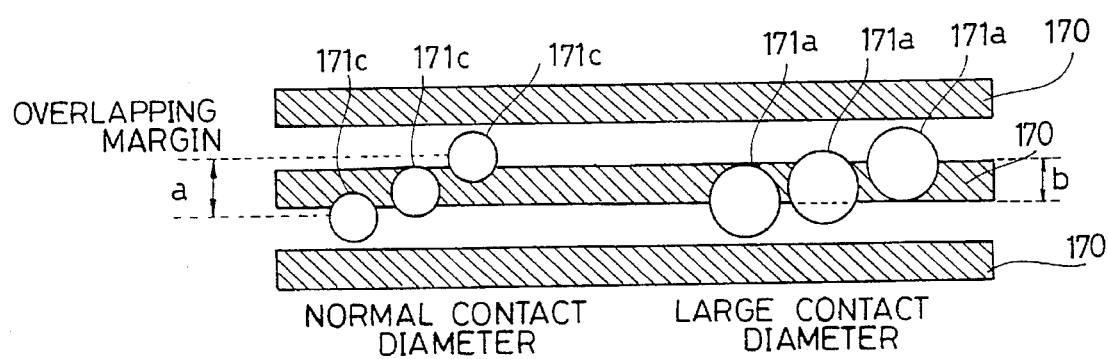
FIG. 53 is a schematic representation for illustrating a problem when a contact hole formed in a layer to be etched is larger than a designed size.

Now, referring to FIGS. 2 and 3, it is understood from the block diagram of the DRAM that an X-address buffer-decoder 32, a Y-address buffer.decoder 33, an R/W control circuit 34, a sense amplifier 35 and a data output buffer 36 are provided on a memory cell array 31. The semiconductor chip area can be reduced compared to the conventional DRAM shown in FIG. 30 by forming the peripheral circuit region such as sense amplifier 35 on the top of memory cell array 31. More specifically, in the case of the DRAM shown in FIG. 30, the semiconductor chip having an area including an area necessary for memory cell array 61 and an area necessary for the peripheral circuits such as sense amplifier 64 is necessary. In contrast, in the case of the preferred embodiment shown in FIG. 3, the semiconductor chip has only an area approximately identical to memory cell array 31, and, therefore, the semiconductor chip area can be reduced compared to the conventional DRAM shown in FIG. 30.

Now, a manufacturing process of a DRAM will be described in conjunction with FIGS. 4 to 19.

Figure 4:
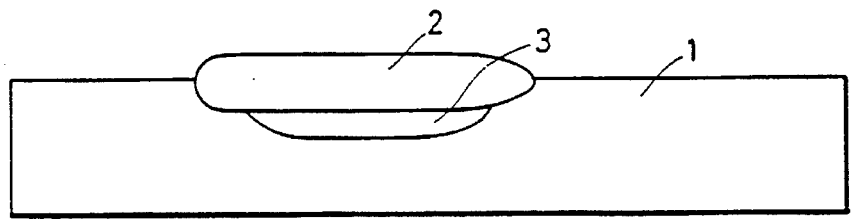
FIGS. 4 to 19 are sectional views for illustrating a manufacturing process of the DRAM shown in FIG. 1.

As shown in FIG. 4, field oxide film for element isolation 2 is formed in a prescribed region on p type semiconductor substrate 1 formed of a silicon substrate by means of LOCOS. P type diffusion layer for element isolation 3 for enhancing element isolation is formed by implanting boron (B) ions into p type semiconductor substrate 1 through field-oxide film 2.

Figure 5:
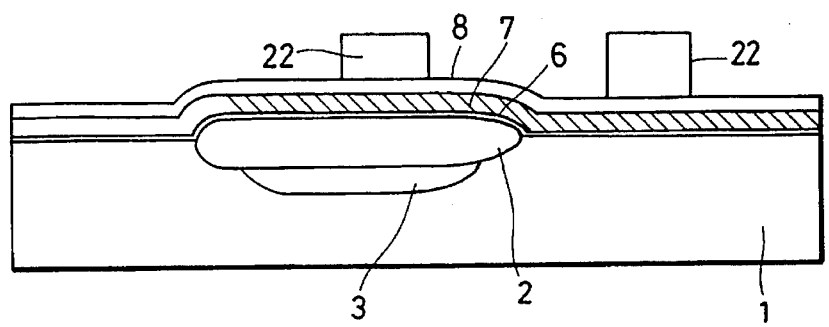

As shown in FIG. 5, gate oxide film (layer) 6, gate electrode (layer) 7, and upper insulating film (layer) 8 are formed. A photoresist pattern 22 is formed in a prescribed region on upper insulating film (layer) 8.

Figure 6:
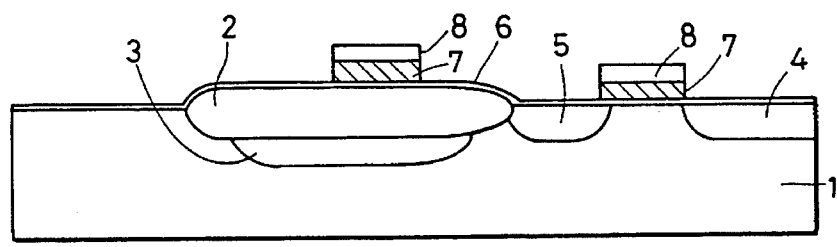

As shown in FIG. 6, gate electrode 7 and upper insulating film 8 are formed by means of selective etching, using photoresist pattern 22 (see FIG. 5) as a mask. Then, photoresist pattern 22 (see FIG. 5) is removed. Thereafter, n type source/drain diffusion layers 4 and 5, and n type diffusion layer 116 are formed, using gate electrode 7 and upper insulating film 8 as well as field oxide film 2 as masks.

Figure 7:
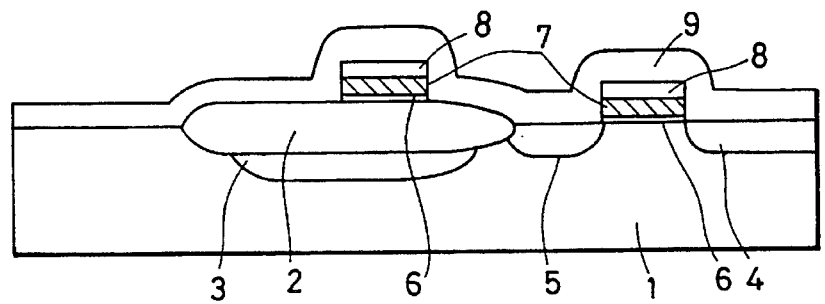

As shown in FIG. 7, sidewall insulating film (layer) 9 is formed on the entire surface.

Figure 8:
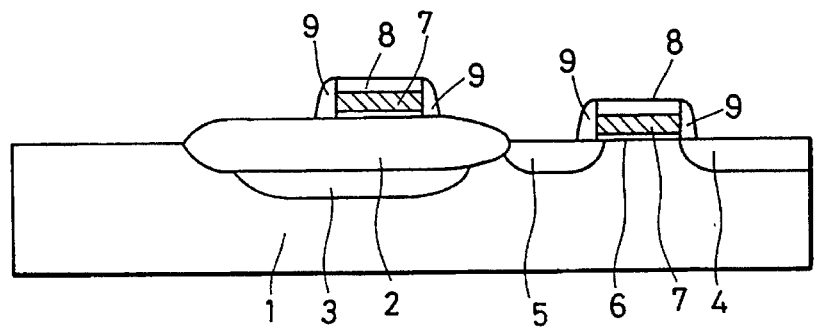

As shown in FIG. 8, sidewall insulating films 9 are formed on the sidewall of gate electrode 7, by etching the entire surface by means of anisotropic etching.

Figure 9:
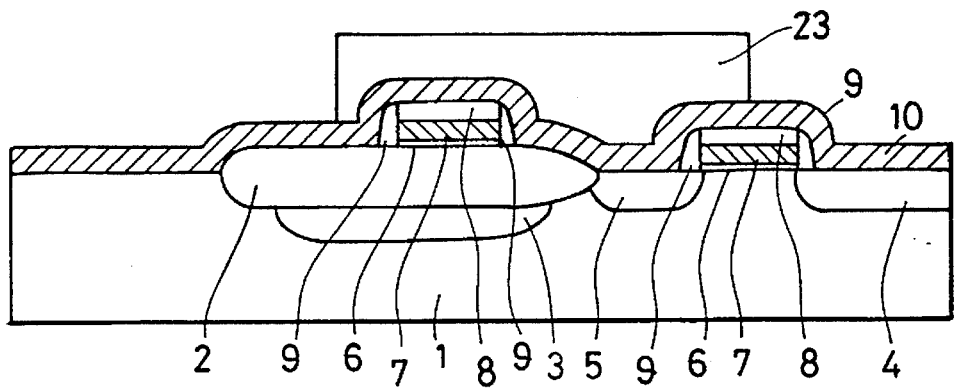
Figure 10:
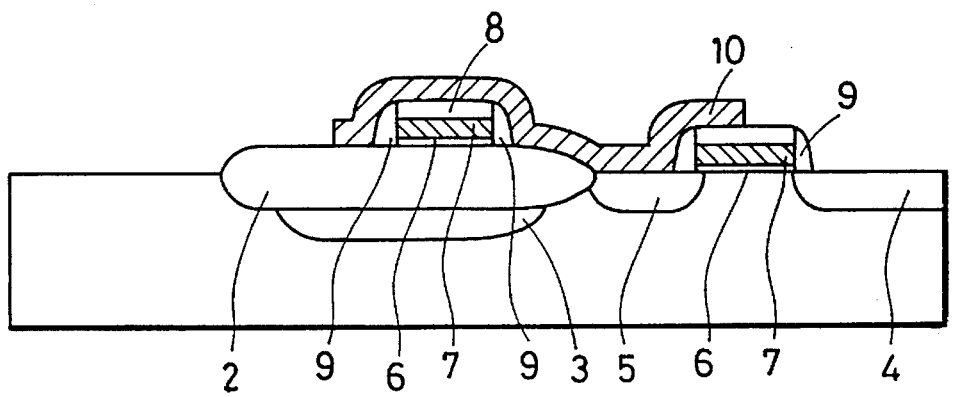

As shown in FIG. 9, storage node (layer) 10 is formed on the entire surface. A photoresist pattern 23 is formed in a prescribed region on storage node (layer) 10. Selective etching is performed using photoresist pattern 23 as a mask, to form storage node 10 shaped as shown in FIG. 10.

Figure 11:
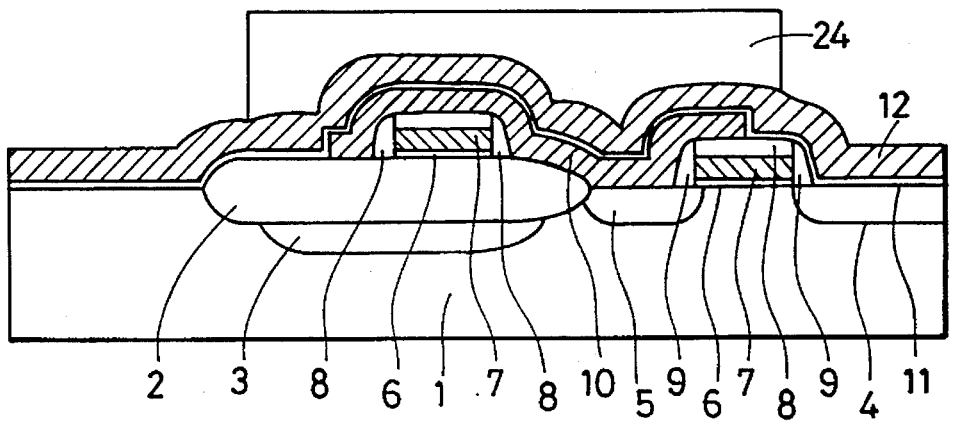
Figure 12:
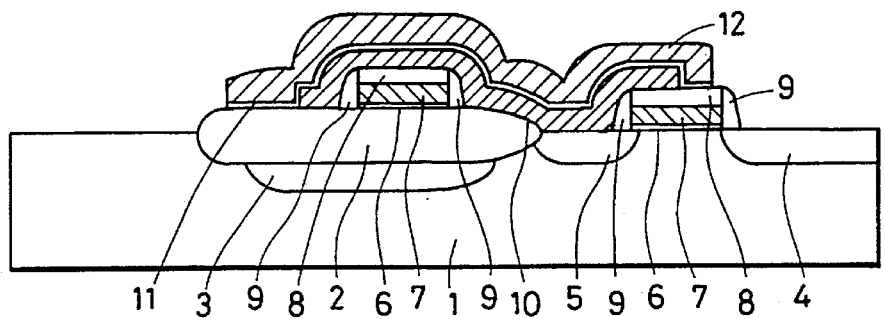

Referring to FIG. 11, capacitor insulating film (layer) 11 and cell plate (layer) 12 are formed on the entire surface. A photoresist pattern 24 is formed in a prescribed region on cell plate (layer) 12. Selective etching is performed using photoresist pattern 24 as a mask. Capacitor insulating film 11 and cell plate 12 with shapes as shown in FIG. 12 are formed as a result. Storage node 10, capacitor insulating film 11 and cell plate 12 constitute a capacitor for storing signal charge.

Figure 13:
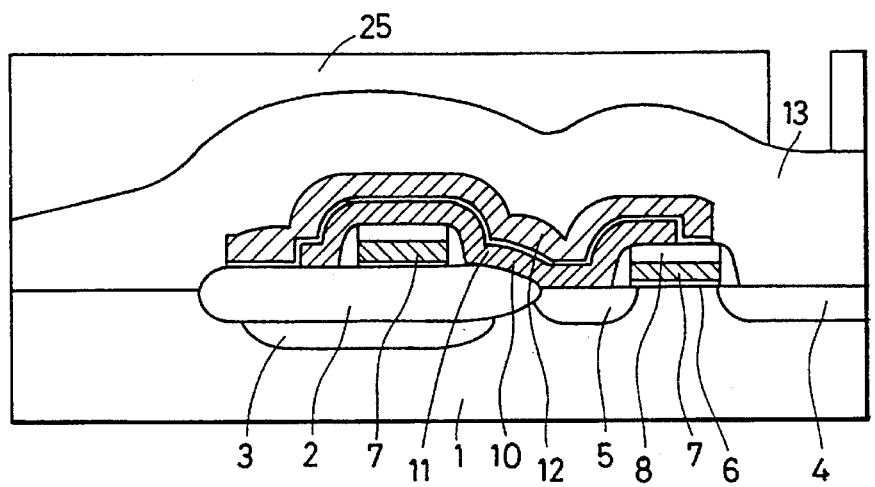
Figure 14:
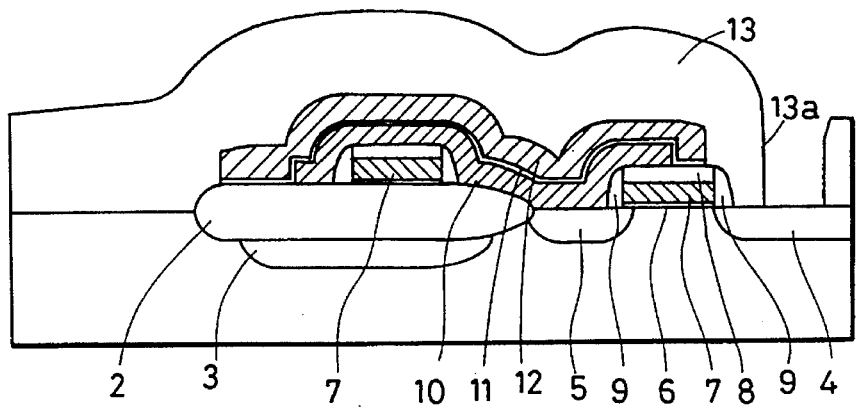

Referring to FIG. 13, interlayer insulating film 13 is formed on the entire surface. A photoresist pattern 25 with portions to be contact holes opened is formed on interlayer insulating film 13. Selective etching is performed using photoresist pattern 25 as a mask, to form a contact hole 13a as shown in FIG. 14. In another manufacturing processing of the preferred embodiment shown in FIGS. 13 and 14, unlike the conventional methods, contact hole 13a is formed only at one place in interlayer insulating film 13. Only one opening is formed in photoresist pattern 25 accordingly. Consequently, no misregistration takes place, unlike the conventional case in which two openings different in depth are formed in photoresist pattern 25. As a result, openings can be formed accurately as designed in size in photoresist pattern 25. Contact hole 13a (see FIG. 14) to be formed in interlayer insulating film 13 can be formed accurately as well.

Figure 15:
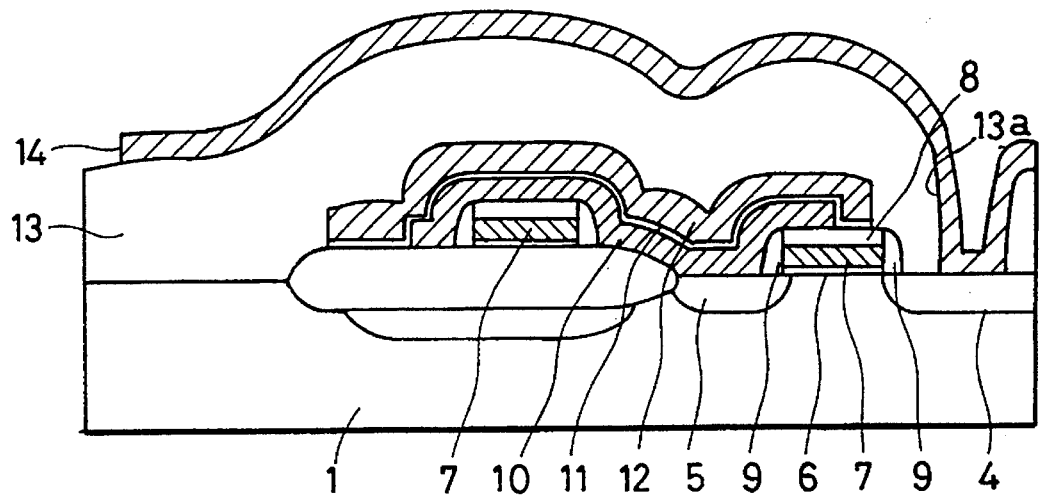

As shown in FIG. 15, polycrystalline silicon layer 14 electrically connected to n type source/drain diffusion layers 4 and extending on interlayer insulating film 13 is formed. Thereafter, polycrystalline silicon layer 14 is patterned to form bit line 14.

Figure 16:
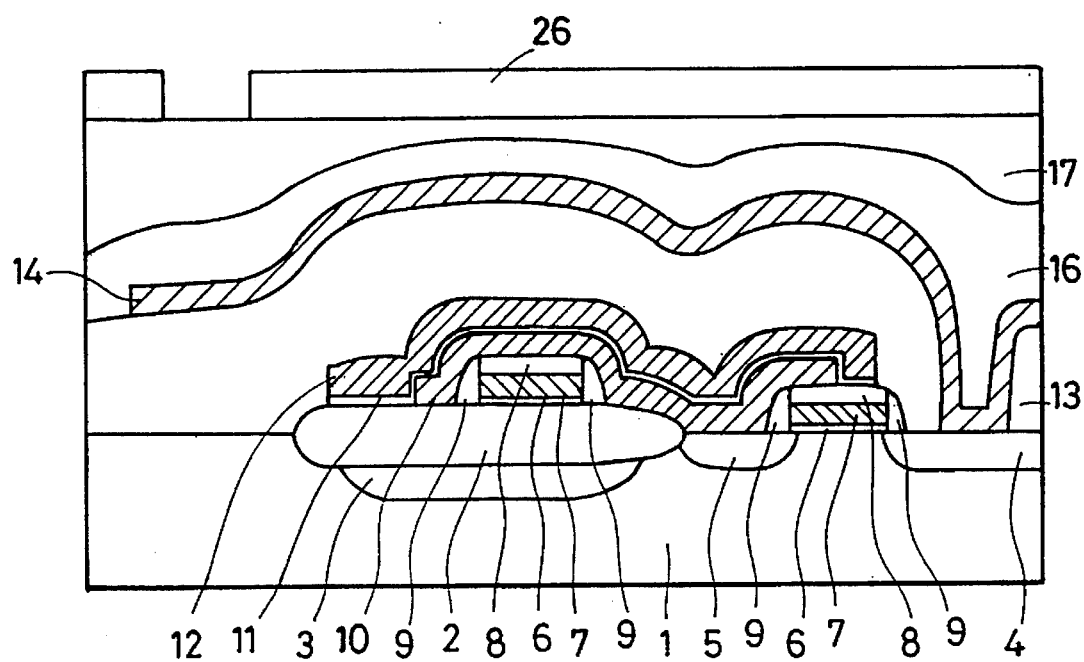
Figure 17:
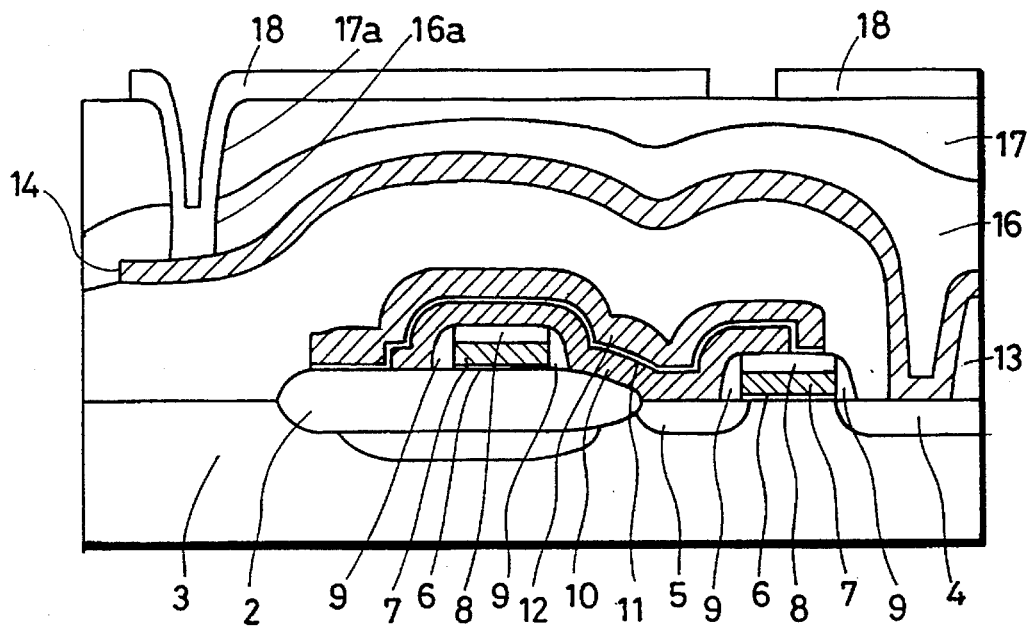

As shown in FIG. 16, after the formation of interlayer insulating films 16 and 17 on the entire surface, planarization is performed thereon. A photoresist pattern 26 having an opening for forming a contact hole is formed on bit line 14. Photoresist pattern 26 is selectively etched and contact holes 16a and 17a as shown in FIG. 17 are formed. Then, polycrystalline silicon layer 18 is formed on the entire surface. Photolithography and selective etching techniques are used to pattern the peripheral circuit. Polycrystalline silicon layer 18 may be monocrystalized by means of thermal treatment.

Figure 18:
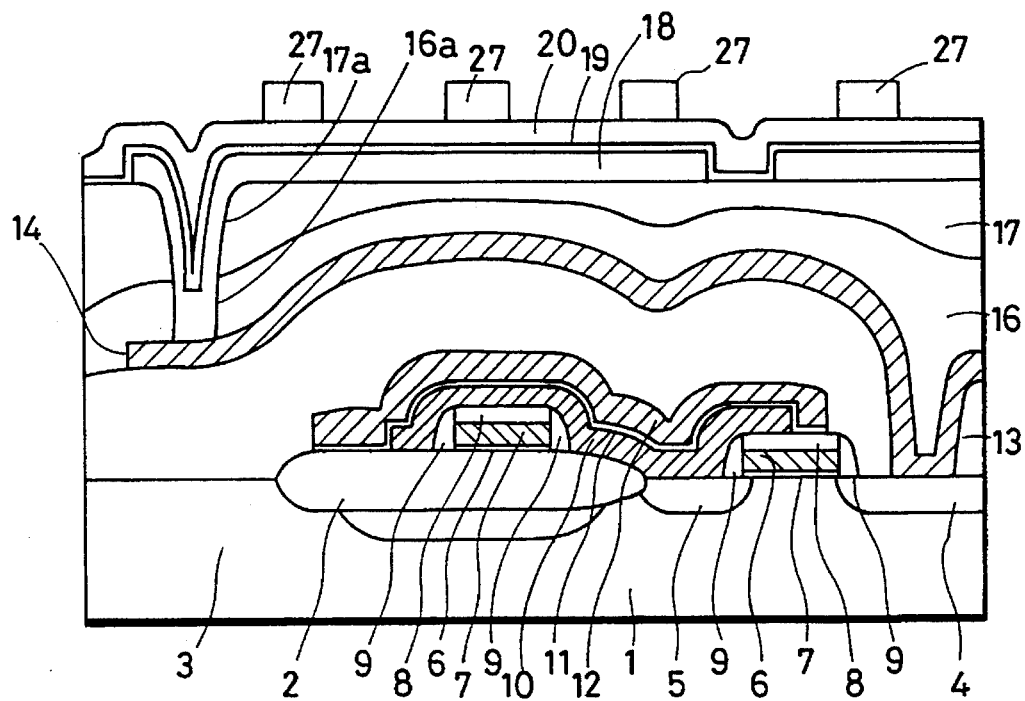
Figure 19:
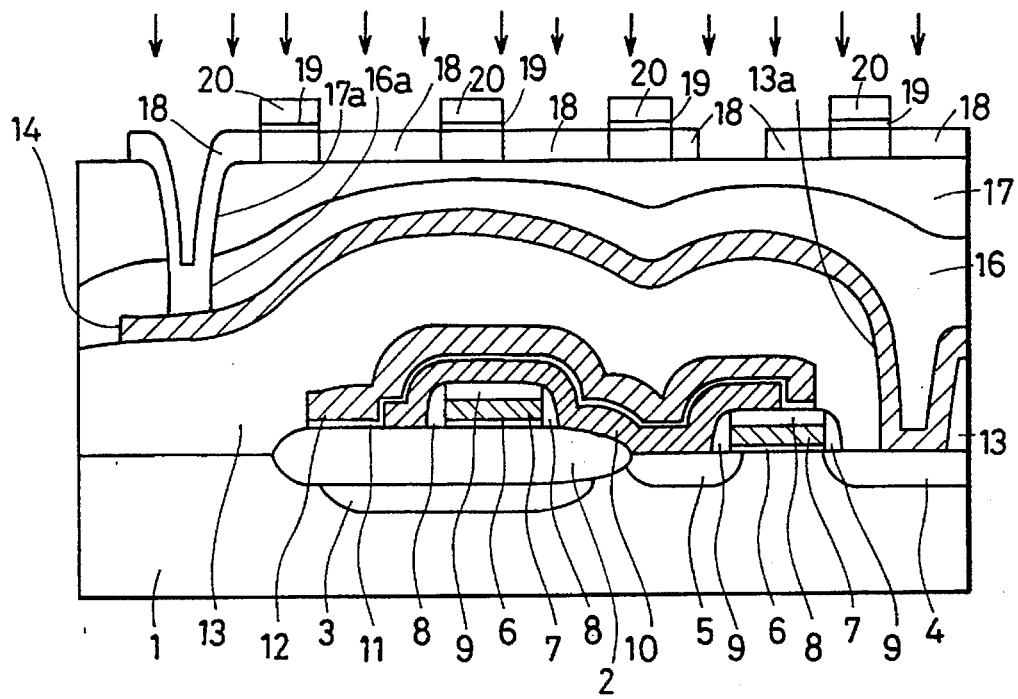

As shown in FIG. 18, TFT gate insulating film (layer) 19 and TFT gate (layer) 20 formed of polycrystalline silicon are formed on the entire surface. A photoresist pattern 27 is formed in a prescribed region on TFT gate (layer) 20. TFT gate (layer) 20 is anisotropically etched, using photoresist pattern 27 as a mask. TFT gate insulating film 19 and TFT gate 20 shaped as shown in FIG. 19 are formed accordingly. Impurity ions are implanted into polycrystalline silicon layer 18, using TFT gate 20 as a mask. Thus, TFT source/drain 18a as shown in FIG. 1 is formed.

As described above, in the manufacturing method of the preferred embodiment, contact hole 13a for connecting bit line 14 and n type source/drain diffusion layer 4, and contact hole 16a for connecting bit line 14 and polycrystalline silicon layer 18 constituting the peripheral circuit are formed in separate manufacturing steps. The above-described problem as observed in the case of conventional methods that the openings of a photoresist pattern for forming contact holes cannot be formed accurately as designed in size can be solved. This results in the accurate formation of contact hole 13a as intended. Bit line 14 having contact resistance of a predetermined value can therefore be formed.

Figure 20:
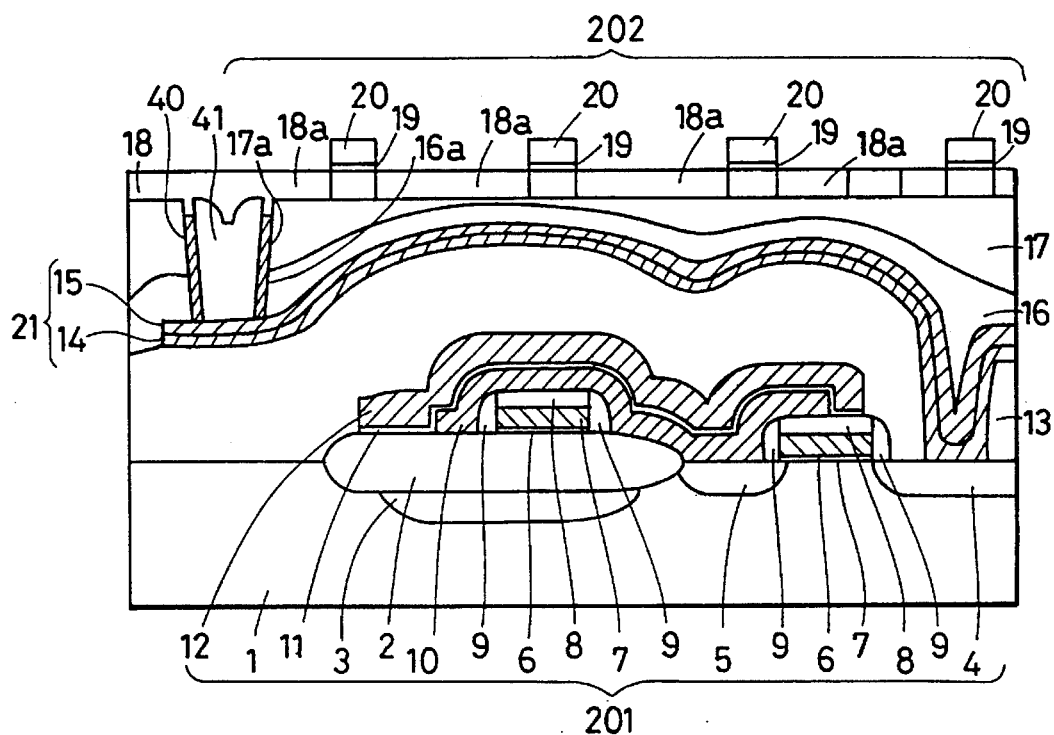
FIG. 20 is a sectional view showing a DRAM in accordance with another embodiment of the present invention.

Now, referring to FIG. 20, in accordance with the another embodiment of the present invention, electrical connection between bit line 21 and polycrystalline silicon layer 18 constituting the peripheral circuit is made by tungsten plug 41 and barrier 40 formed in contact holes 16a and 17a. A bit line 21 consists of polysilicon layer 14 and tungsten silicide layer 15. Such a method using tungsten plug 41 is advantageous when contact holes 16a and 17a are formed deep. More specifically, with contact holes 16a and 17a being deep, it will be difficult to form polycrystalline silicon layer 18 in contact holes 16a and 17a.

FIGS. 21–26 are cross sectional views for illustrating the manufacturing process (from the first step to the sixth step) of the second embodiment shown in FIG. 20. Referring to FIGS. 20–26, a description of the manufacturing process of the DRAM of the second embodiment shown in FIG. 20 follows.

Figure 21:
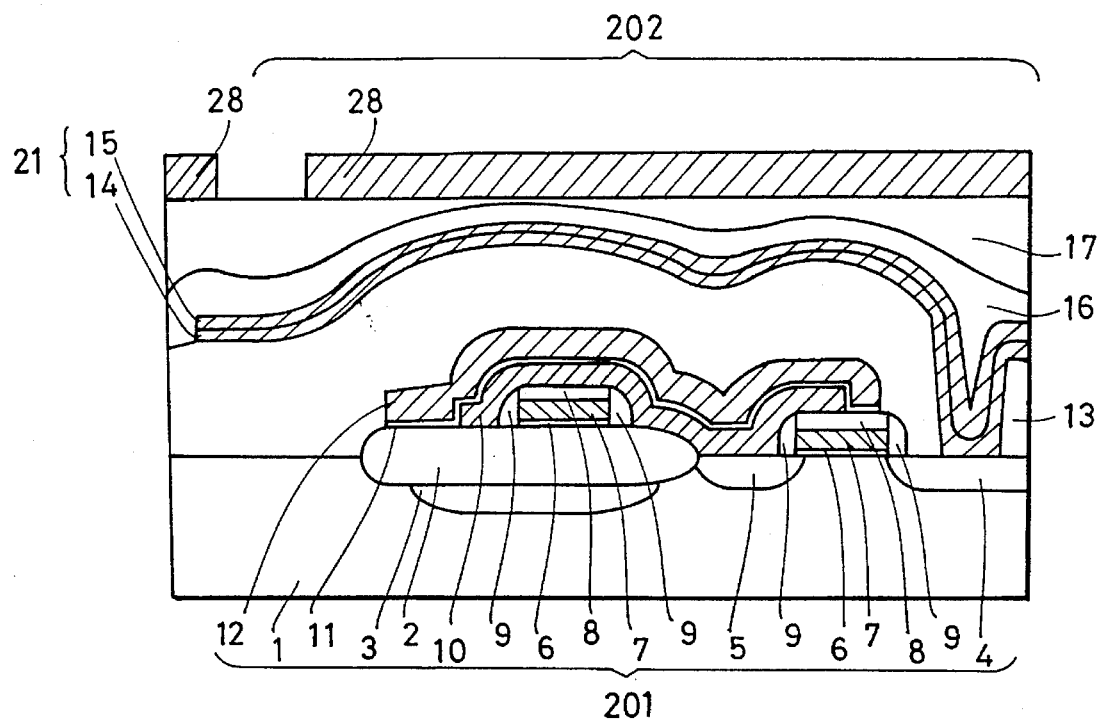
FIG. 21 is a cross sectional view for illustrating the first step in the manufacturing process of the DRAM of the second embodiment shown in FIG. 20.
Figure 22:
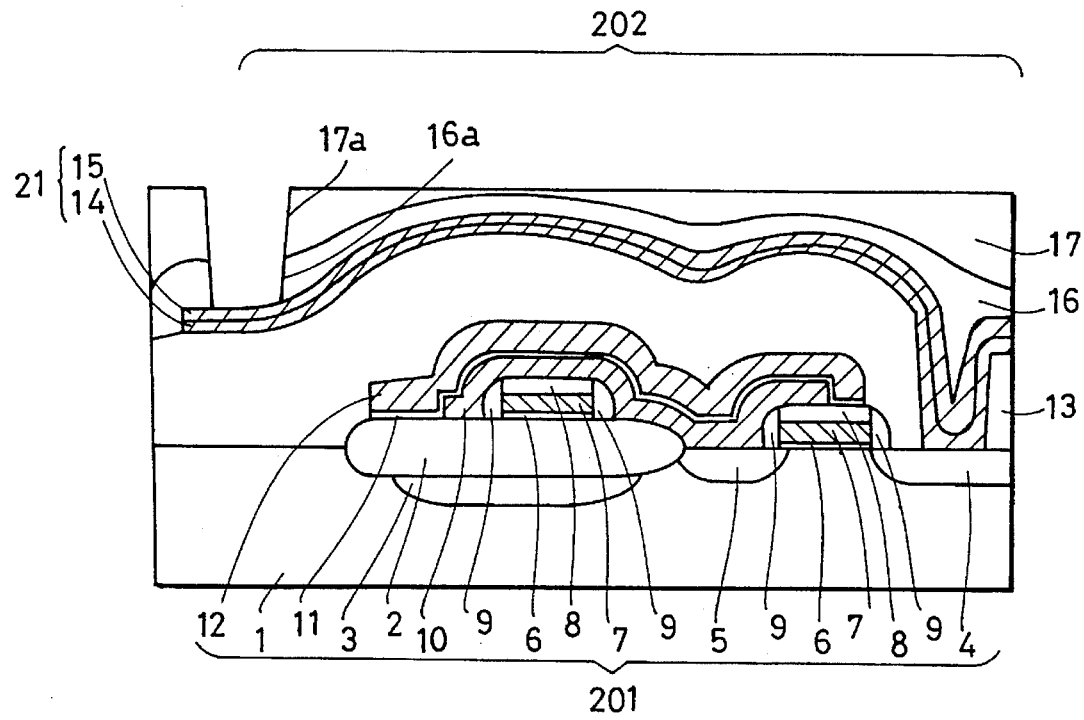
FIG. 22 is a cross sectional view for illustrating the second step in the manufacturing process of the DRAM of the second embodiment shown in FIG. 20.

As shown in FIG. 21, an interlayer insulating film 13 is formed using the same process as the manufacturing process of the first embodiment shown in FIGS. 4 through 14. A polycrystalline silicon layer 14 is formed which is electrically connected to an n type source/drain diffusion layer 4 and extends on interlayer insulating film 13. A tungsten silicide layer 15 is formed on polycrystalline silicon layer 14. Polycrystalline silicon layer 14 and tungsten silicide layer 15 are then patterned to form a bit line 21. Then, interlayer insulating films 16 and 27 are formed on the entire surface, and then the surface of interlayer insulating film 17 is planarized by means of reflow method. Formed on bit line 21 is photoresist pattern 28 having an opening for forming a contact hole. The photoresist pattern 28 is selectively etched and contact holes 16a and 17a as shown in FIG. 22 are formed as a result.

Figure 23:
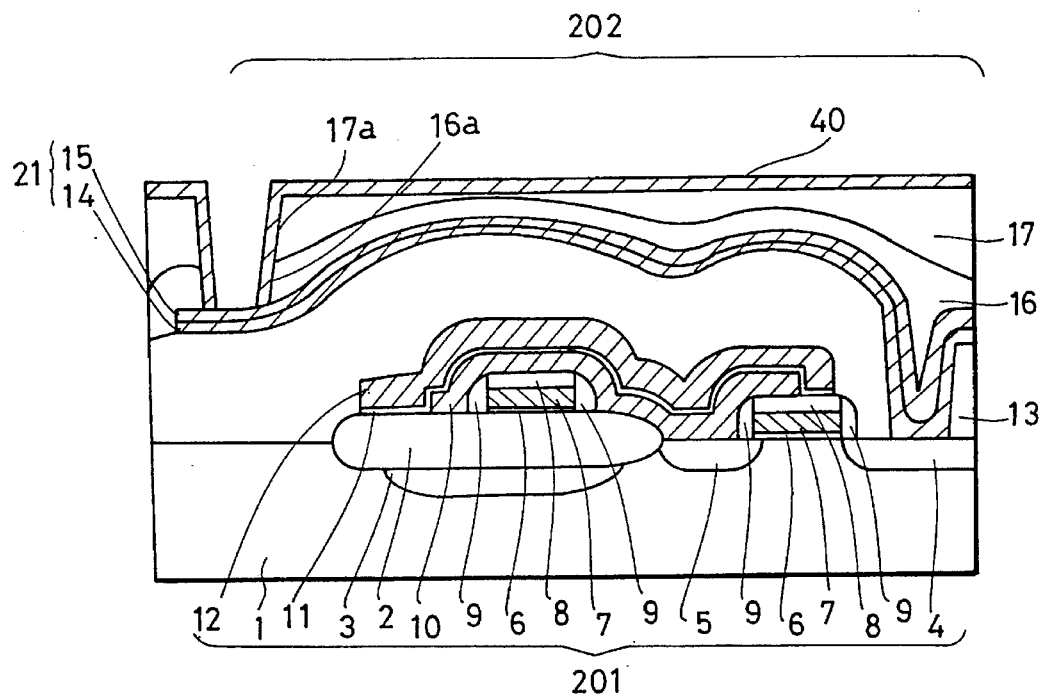
FIG. 23 is a cross sectional view for illustrating the third step in the manufacturing process of the DRAM of the second embodiment shown in FIG. 20.

Then, as shown in FIG. 23, a barrier layer 40 is formed on the entire surface.

TiN formed by forming Ti about as thick as 500 Å by means of sputtering, and heat-treating the same in an ammonium atmosphere at 900° C. for 30 minutes is, for example, used for barrier layer 40.

Figure 24:
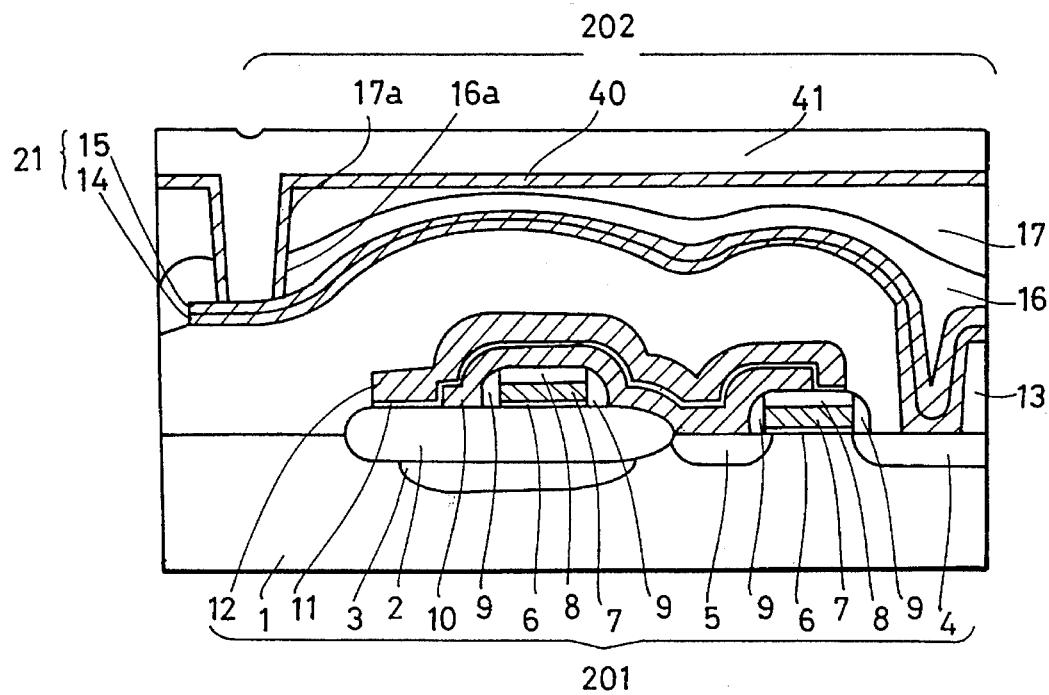
FIG. 24 is a cross sectional view for illustrating the fourth step in the manufacturing process of the DRAM of the second embodiment shown in FIG. 20.

As shown in FIG. 24, a tungsten layer 41 having a thickness about in the range between 3000 and 5000 Å is formed on the entire surface. Tungsten layer 41 may be formed of another material whose contact resistance is low and which is heat-resistant.

Figure 25:
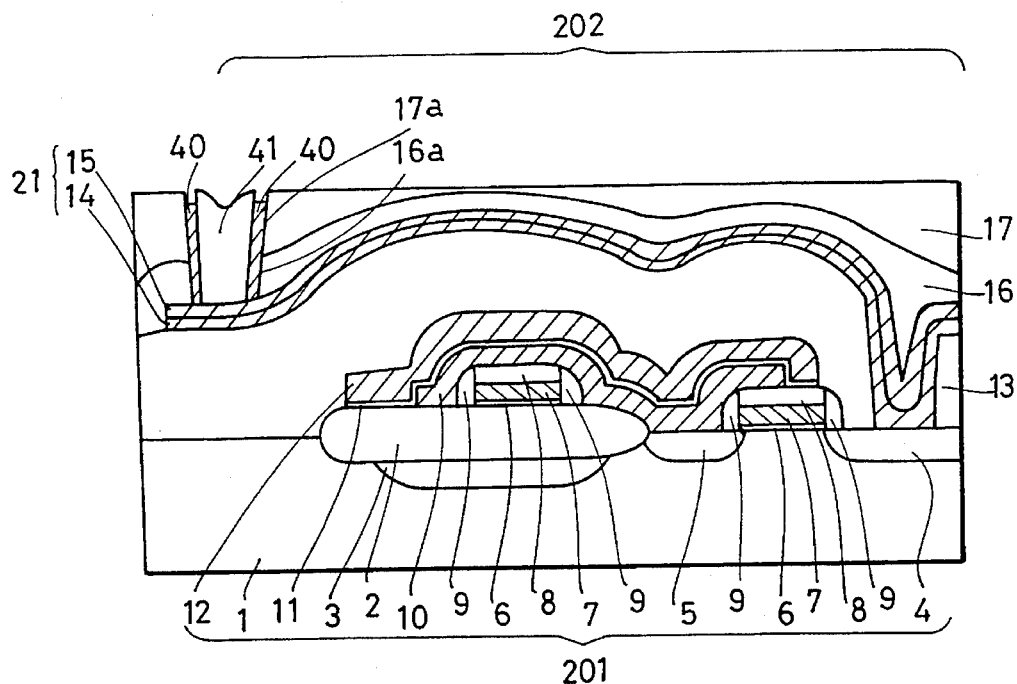
FIG. 25 is a cross sectional view for illustrating the fifth step in the manufacturing process of the DRAM of the second embodiment shown in FIG. 20.

As shown in FIG. 25, barrier layer 40 and tungsten layer 41 are etched back to leave barrier layer 40 and tungsten layer 41 only in the contact portion.

Figure 26:
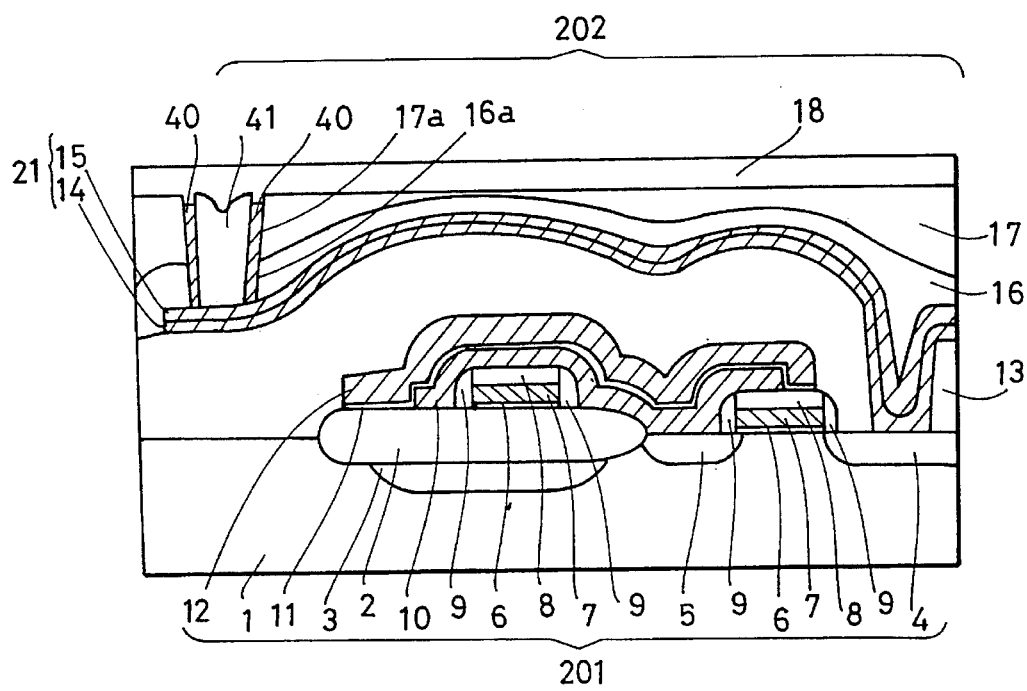
FIG. 26 is a cross sectional view for illustrating the sixth step in the manufacturing process of the DRAM of the second embodiment shown in FIG. 20.

Then, as shown in FIG. 26, a polysilicon layer 18 is formed on the entire surface.

After going through the same process thereafter as the first embodiment, the DRAM of the second embodiment shown in FIG. 20 is provided.

Figure 27:
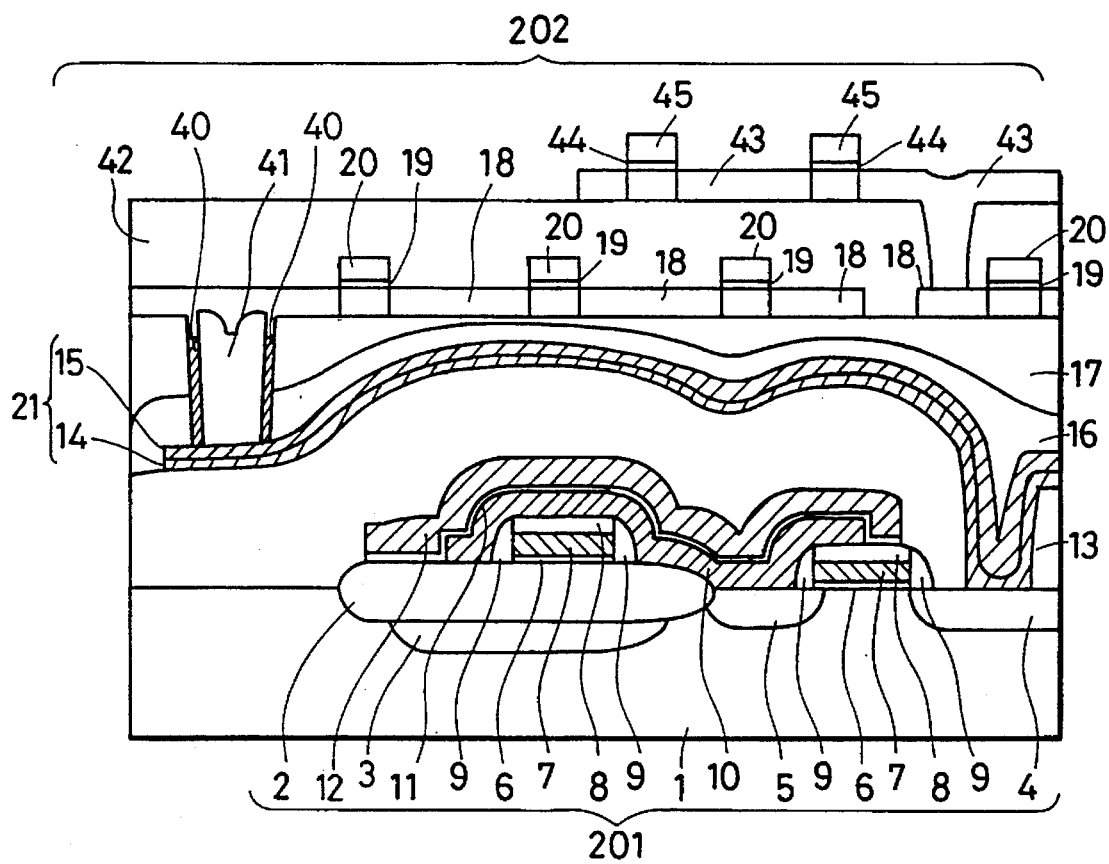
FIG. 27 is a sectional view showing a DRAM in accordance with another embodiment of the present invention.

Now, referring to FIG. 27, in accordance with another embodiment of the present invention, peripheral circuit 202 is of a multi-layer structure. With peripheral circuit 202 being of a multi-layer structure, higher-density integration can be achieved.

Figure 28:
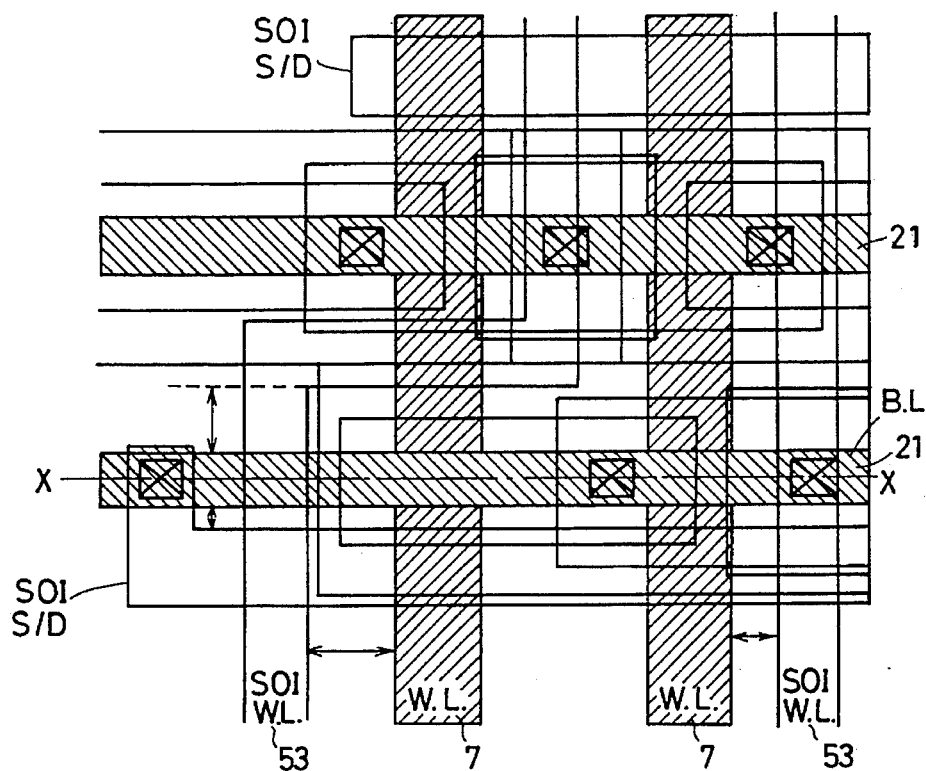
FIG. 28 is a plan layout showing a DRAM in accordance with another embodiment of the present invention.
Figure 29:
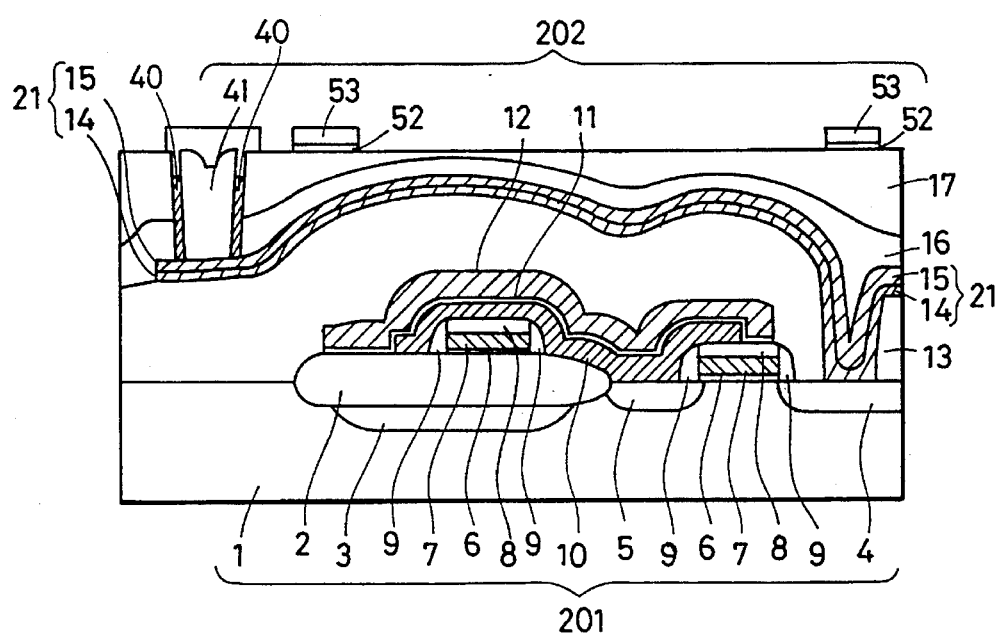
FIG. 29 is a sectional view showing the DRAM shown in FIG. 28 taken along line X—X.

Referring to FIGS. 28 and 29, in accordance with another embodiment of the present invention, the gate electrode (word line) 7 of memory cell array 201 and the TFT gate 53 of peripheral circuit 202 are provided so that they are not in one plane. More specifically, consider that the direction in which gate electrode 7 extends is X direction, and the direction 90° shifted relative to X direction is Y direction. In this case, the gate electrode 7 of memory cell array 201 and the TFT gate 53 of the peripheral circuit are disposed so that they are a prescribed distance offset or (shifted) from each other in X direction. As described above, the gate electrode (word line) 7 of memory cell array 201 and the TFT gate (word line) 53 of peripheral circuit 202 are offset from each other, and, therefore, associated problems such as increase of interconnection capacities or crosstalk between memory cell array 201 and peripheral circuit 202 can be effectively solved.

As in the foregoing, in a semiconductor device in accordance with the present invention, a peripheral circuit region is formed over a memory cell region, and, therefore, a large part of a semiconductor chip area can be used for a memory cell region, thereby increasing its integration density.

Also in a manufacturing method of a semiconductor device in accordance with the present invention, an insulating layer having a contact hole is formed on a memory cell after the memory cell is formed on a semiconductor substrate, and therefore, the formation of a contact hole for connecting a bit line to a memory cell region and the formation of a contact hole for connecting a bit line to a peripheral circuit region can be separately performed. Consequently, accuracy in forming a contact hole for contacting a bit line to the semiconductor substrate can be improved.

Furthermore, in another manufacturing method of a semiconductor device in accordance with the present invention, after a first insulating layer covering a transistor and a capacitor formed on a semiconductor substrate is formed, an impurity region is exposed by etching a prescribed region of the first insulating layer. A bit line is formed thereafter. After a second insulating layer is formed on the bit line, a part of the bit line is exposed by etching a prescribed region of the second insulating layer. Consequently, a contact hole for connecting the bit line to a memory cell array region and a contact hole for connecting the bit line to a peripheral circuit region can be formed in separate manufacturing steps. Accuracy in forming contact holes for contacting bit line to the semiconductor substrate can be improved as a result.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a memory cell region formed on a semiconductor substrate;
   an insulating layer having a contact hole and covering said entire memory cell region;
   a conductive layer formed in said contact hole; and
   a peripheral circuit formed on said insulating layer and electrically connected to said memory cell region through said conductive layer;
   wherein the peripheral circuit comprises a sense amplifier for amplifying a signal stored in a memory cell and reading out the amplified signal.

2. A semiconductor device as recited in claim 1, wherein said peripheral circuit at least partially overlaps said memory cell region.

3. A semiconductor device as recited in claim 2, wherein said peripheral circuit completely overlaps said memory cell region.

4. A semiconductor device as recited in claim 1, wherein said conductive layer is formed so as to fill the space in said contact hole.

5. A semiconductor device as recited in claim 4, wherein said conductive layer is of tungsten.

6. A semiconductor device as recited in claim 1, wherein said memory cell array region comprises,
   a semiconductor substrate;
   a pair of impurity regions formed on the main surface of said semiconductor substrate and a prescribed distance apart from each other;
   a gate electrode formed between said pair of impurity regions with a gate insulating film therebetween;
   a capacitor connected to one of said impurity regions for storing signal charge; and
   a bit line connected to the other of said impurity regions.

7. A semiconductor device as recited in claim 6, wherein said bit line is formed extending over said capacitor,
   an insulating layer having a contact hole is formed on said bit line, and
   said bit line and said peripheral circuit are electrically connected through a conductive layer formed in said contact hole.

8. A semiconductor device as recited in claim 1, wherein said peripheral circuit comprises,
   an X-address buffer decoder for receiving an external signal for selecting a memory cell and for selecting a word line; and
   a Y-address buffer decoder for receiving an external signal for selecting a memory cell and for selecting a bit line.

9. A semiconductor device as recited in claim 1, wherein said peripheral circuit comprises
   a sense amplifier for amplifying a signal stored in a memory cell and reading out the amplified signal;
   an X-address buffer decoder for receiving an external signal for selecting a memory cell and for selecting a word line;
   a Y-address buffer decoder for receiving an external signal for selecting a memory cell and for selecting a bit line;
   a data output buffer for externally outputting data; and
   an R (Read)/W (Write) control circuit for giving instructions as to the writing/reading of data.

10. A semiconductor device as recited in claim 1, wherein said peripheral circuit comprises, a polycrystalline silicon layer formed on said memory cell array region with an insulating layer therebetween;

impurity regions formed on the main surface of said polycrystalline silicon layer and a prescribed distance apart from each other; and a gate electrode formed between said impurity regions adjacent to each other through a gate insulating film, one end of said polycrystalline silicon layer being electrically connected to said memory cell array region through an opening provided in said insulating layer.

11. A semiconductor device as recited in claim 1, wherein said peripheral circuit comprises a first peripheral circuit region, and a second peripheral circuit region formed on said first peripheral circuit region with an insulating layer therebetween.

12. A semiconductor device as recited in claim 1, wherein said memory cell region comprises a gate electrode extending in an X direction, and said peripheral circuit comprises a gate electrode extending in the X direction, and offset from the gate electrode of said memory cell array region in a Y direction intersecting said X direction.

13. A semiconductor device as recited in claim 6, wherein said bit line comprises a polycrystalline silicon layer connected to said other impurity region and a tungsten silicide layer formed on said polycrystalline silicon layer, said bit line being formed extending over said capacitor, an insulating layer having a contact hole is formed on said bit line, and said bit line and said peripheral circuit are electrically connected through a tungsten layer formed in said contact hole.

14. A semiconductor device as recited in claim 2, wherein the top plane of said insulating layer is flattened.

15. A semiconductor device, comprising:

a memory cell region for storing a data signal, an insulating layer entirely overlying said memory cell region, a peripheral circuit region formed on said insulating layer above said memory cell, and a first conductive layer in contact with said memory cell region, formed on said insulating layer, extending above said memory cell region and beneath said peripheral circuit region.

16. The device of claim 15, including a second conductive layer above, and connecting said peripheral circuit to, said first conductive layer.

17. A semiconductor device as recited in claim 1, wherein said peripheral circuit includes at least one active element.

18. A semiconductor device as recited in claim 17, wherein said active element is a transistor.

19. A semiconductor device as recited in claim 18, wherein said transistor is a thin film transistor.

20. A semiconductor device as recited in claim 15, wherein said peripheral circuit region includes at least one active element.

21. A semiconductor device as recited in claim 20, wherein said active element is a transistor.

22. A semiconductor device as recited in claim 21, wherein said transistor is a thin film transistor.

* * * * *